United States Patent
Mori et al.

(10) Patent No.: US 10,411,615 B2
(45) Date of Patent: Sep. 10, 2019

(54) POWER CONVERTER

(71) Applicant: Mitsubishi Electric Corporation, Tokyo (JP)

(72) Inventors: Tatsuya Mori, Tokyo (JP); Akira Furukawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/079,176

(22) PCT Filed: Mar. 28, 2016

(86) PCT No.: PCT/JP2016/059931
§ 371 (c)(1),
(2) Date: Aug. 23, 2018

(87) PCT Pub. No.: WO2017/168522
PCT Pub. Date: Oct. 5, 2017

(65) Prior Publication Data
US 2019/0058418 A1    Feb. 21, 2019

(51) Int. Cl.
*H02M 7/5395*    (2006.01)
*G01R 31/40*    (2014.01)
(Continued)

(52) U.S. Cl.
CPC .......... *H02M 7/5395* (2013.01); *G01R 31/40* (2013.01); *H02M 1/08* (2013.01);
(Continued)

(58) Field of Classification Search
CPC ........ H02M 7/5395; H02M 1/08; H02M 1/44; H02M 2001/0009; G01R 31/40; H02P 27/08
See application file for complete search history.

(56) References Cited

U.S. PATENT DOCUMENTS

2006/0056206 A1    3/2006  Kifuku et al.
2010/0165682 A1*   7/2010  Sakakibara ............. H02P 27/08
                                                      363/126
(Continued)

FOREIGN PATENT DOCUMENTS

EP    2 413 488 A1    2/2012
JP    2577738 B2     2/1997
JP    5354369 B2    11/2013

OTHER PUBLICATIONS

Partial Supplementary European Search Report dated Mar. 8, 2019 issued by the European Patent Office in counterpart application No. 16896742.0.

(Continued)

*Primary Examiner* — Kyle J Moody
(74) *Attorney, Agent, or Firm* — Sughrue Mion, PLLC; Richard C. Turner

(57) ABSTRACT

Includes: a first offset voltage computing section, which is configured to compute, when the three-phase voltage commands are determined as a maximum phase, an intermediate phase, and a minimum phase in descending order, a first offset voltage by subtracting a first DC voltage calculated by multiplying the DC voltage by a first constant from the maximum phase, and to set the first offset voltage to zero when a sign of the first offset voltage is negative; a corrected three-phase voltage command computing section, which is configured to subtract the first offset voltage from each phase of the three-phase voltage commands to output corrected three-phase voltage commands; and an inverter, which is configured to output the three-phase voltages based on the corrected three-phase voltage commands.

18 Claims, 19 Drawing Sheets

(51) Int. Cl.
    *H02M 1/08*     (2006.01)
    *H02M 7/5387*     (2007.01)
    *H02M 1/44*     (2007.01)
    *H02M 1/00*     (2006.01)
    *H02P 27/08*     (2006.01)

(52) U.S. Cl.
    CPC ... *H02M 7/53871* (2013.01); *H02M 7/53875* (2013.01); *H02M 1/44* (2013.01); *H02M 2001/0009* (2013.01); *H02M 2001/0025* (2013.01); *H02P 27/08* (2013.01)

(56) References Cited

U.S. PATENT DOCUMENTS

| | | |
|---|---|---|
| 2011/0292700 A1 | 12/2011 | Arakawa et al. |
| 2012/0206075 A1 | 8/2012 | Kimpara et al. |
| 2014/0176027 A1* | 6/2014 | Osaki ............... H02P 27/08 318/400.2 |
| 2016/0211774 A1* | 7/2016 | Degner ............ H02M 7/53875 |
| 2019/0006978 A1* | 1/2019 | Yamasaki ............ H02P 27/085 |

OTHER PUBLICATIONS

Communication dated May 20, 2019 from European Patent Office in counterpart EP Application No. 16896742.0.

* cited by examiner

Memo:
in S502:Vmim→Vmin

POWER CONVERTER

This application is a National Stage of International Application No. PCT/JP2016/059931 filed Mar. 28, 2016.

TECHNICAL FIELD

The present invention relates to a power converter, which is configured to convert a DC voltage into three-phase voltages based on three-phase voltage commands to output the three-phase voltages.

BACKGROUND ART

There has hitherto been disclosed a PWM inverter device including first means for generating a three-phase modulation switching signal to perform a switching operation for each of phases of a PWM inverter and second means for generating a two-phase modulation switching signal that eliminates need of the switching operation for one of the phases. The PWM inverter device switches between the two means based on an amplitude value of inverter output voltages (see, for example, Patent Literature 1).

Further, there has been disclosed a power converter, which reduces noise and vibration by using lower solid two-phase modulation or upper solid two-phase modulation when a modulation factor being an amplitude of a duty command signal to a power-supply voltage is larger than a first predetermined value and by controlling a neutral voltage so that the neutral voltage becomes approximately half of a capacitor voltage when the modulation factor is equal to or smaller than the first predetermined value (see, for example, Patent Literature 2).

CITATION LIST

Patent Literature

[PTL 1] JP 2577738 B2
[PTL 2] JP 5354369 B2

SUMMARY OF INVENTION

Technical Problem

When the three-phase modulation is used, occurrence of voltage saturation depends on the amplitude value of the inverter output voltages and a voltage phase of a voltage vector from a reference direction. Therefore, even in a case of an amplitude value that may cause the voltage saturation with the three-phase modulation, the voltage is not constantly saturated. Depending on the voltage phase, the voltage saturation does not occur. Under such operating conditions, output of the three-phase modulation and the two-phase modulation in accordance with the voltage phase is advantageous in terms of reduction of distortion factors of the output voltages and reduction in noise and vibration.

In Patent Literature 1 and Patent Literature 2, however, the modulation is constantly switched to the two-phase modulation based on the amplitude or the modulation factor. Specifically, the two-phase modulation is used even for a region in which the voltage saturation can be prevented without switching to the two-phase modulation depending on the voltage phase. Therefore, there is a problem in that degradation of the distortion factors of the output voltages and increase in noise and vibration of a motor are brought about. Further, when the modulation system is switched, there is a problem in that the noise and the vibration of the motor are increased due to occurrence of a discontinuous voltage change.

The present invention has been made to solve the problems described above, and has an object to provide a power converter capable of reducing distortion factors of output voltages and also reducing noise and vibration.

Solution to Problems

According to one embodiment of the present invention, there is provided a power converter, which is configured to convert a DC voltage into three-phase voltages based on three-phase voltage commands each being a sine wave to output the three-phase voltages, the power converter including: a first offset voltage computing section, which is configured to compute, when the three-phase voltage commands are determined as a maximum phase, an intermediate phase, and a minimum phase in descending order, a first offset voltage by subtracting a first DC voltage calculated by multiplying the DC voltage by a first constant from the maximum phase, and to set the first offset voltage to zero when a sign of the first offset voltage is negative; a corrected three-phase voltage command computing section, which is configured to subtract the first offset voltage from each phase of the three-phase voltage commands to output corrected three-phase voltage commands; and an inverter, which is configured to output the three-phase voltages based on the corrected three-phase voltage commands.

Advantageous Effects of Invention

In the power converter according to the present invention, the first offset voltage computing section is configured to compute, when the three-phase voltage commands are determined as the maximum phase, the intermediate phase, and the minimum phase in descending order, a first offset voltage by subtracting a first DC voltage calculated by multiplying the DC voltage by a first constant from the maximum phase, and to set the first offset voltage to zero when a sign of the first offset voltage is negative, and the corrected three-phase voltage command computing section is configured to subtract the first offset voltage from each phase of the three-phase voltage commands to output corrected three-phase voltage commands. Therefore, the distortion factors of the output voltages can be reduced, while the noise and the vibration can be reduced.

DESCRIPTION OF EMBODIMENTS

A description is now given of a power converter according to preferred embodiments of the present invention referring to the accompanying drawings, and throughout the drawings, like or corresponding components are denoted by like reference symbols to describe those components.

First Embodiment

Figure 1:
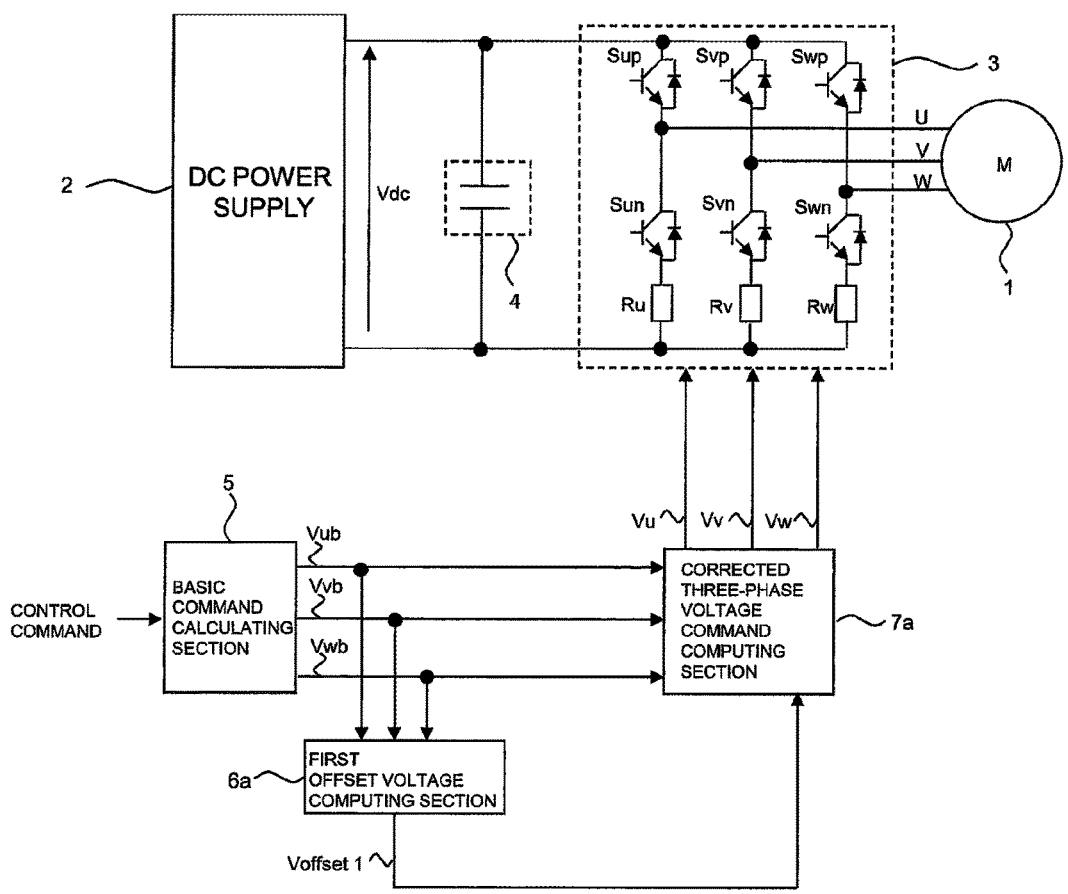
FIG. 1 is an overall configuration diagram for illustrating a power converter according to a first embodiment of the present invention.

FIG. 1 is an overall configuration diagram for illustrating a power converter according to a first embodiment of the present invention. In FIG. 1, an AC rotating machine 1 is an AC rotating machine including three-phase windings U, V, and W, and is, for example, a permanent-magnet synchronous rotating machine, a wound field synchronous rotating machine, an induction rotating machine, or a synchronous reluctance motor.

A DC power supply 2 outputs a DC voltage Vdc to an inverter 3. As the DC power supply, all devices that output a DC voltage, such as a battery, a DC-to-DC converter, a diode rectifier, and a PWM rectifier, are included. The first to seventh embodiments of the present invention are described below, assuming that Vdc is 10 V.

The inverter 3 performs PWM modulation with, for example, a carrier period Tc of 50 μs based on corrected three-phase voltage commands Vu, Vv, and Vw and the DC voltage Vdc input from the DC power supply 2, and then applies voltages to the three-phase windings U, V, and W of the AC rotating machine 1.

As each of switching elements Sup, Svp, Swp, Sun, Svn, and Swn, a switching element obtained by connecting a semiconductor switching element such as an IGBT, a bipolar transistor, or a MOS power transistor and a diode in antiparallel is used. Current detection resistive elements Ru, Rv, and Rw are provided in series to lower arm elements Sun, Svn, and Swn of the inverter 3.

The current detection resistive element Ru acquires a voltage across Sun at timing at which Sun is turned on, thereby detecting a current flowing through the U-phase winding of the AC rotating machine 1. The current detection resistive element Rv acquires a voltage across Svn at timing at which Svn is turned on, thereby detecting a current flowing through the V-phase winding of the AC rotating machine 1. The current detection resistive element Rw acquires a voltage across Swn at timing at which Swn is turned on, thereby detecting a current flowing through the W-phase winding of the AC rotating machine 1.

A smoothing capacitor 4 is a capacitor, which is configured to stabilize the DC voltage Vdc of the DC power supply 2. A basic command calculating section 5 computes three-phase voltage commands Vub, Vvb and Vwb for driving the AC rotating machine 1.

As a method of computing the three-phase voltage commands Vub, Vvb, and Vwb, there is given V/F control, which determines an amplitude of the three-phase voltage commands after setting a speed (frequency) command for the AC rotating machine 1 as a control command in FIG. 1. Further, there is used a well-known technology, for example, current feedback control, which sets a current command for the AC rotating machine 1 as the control command and computes the three-phase voltage commands Vub, Vvb, and Vwb through proportional-integral control based on a deviation between the current command and currents of the AC rotating machine 1, which are detected by the current detection resistive elements Ru, Rv, and Rw, so as to make the deviation equal to zero.

Figure 2:
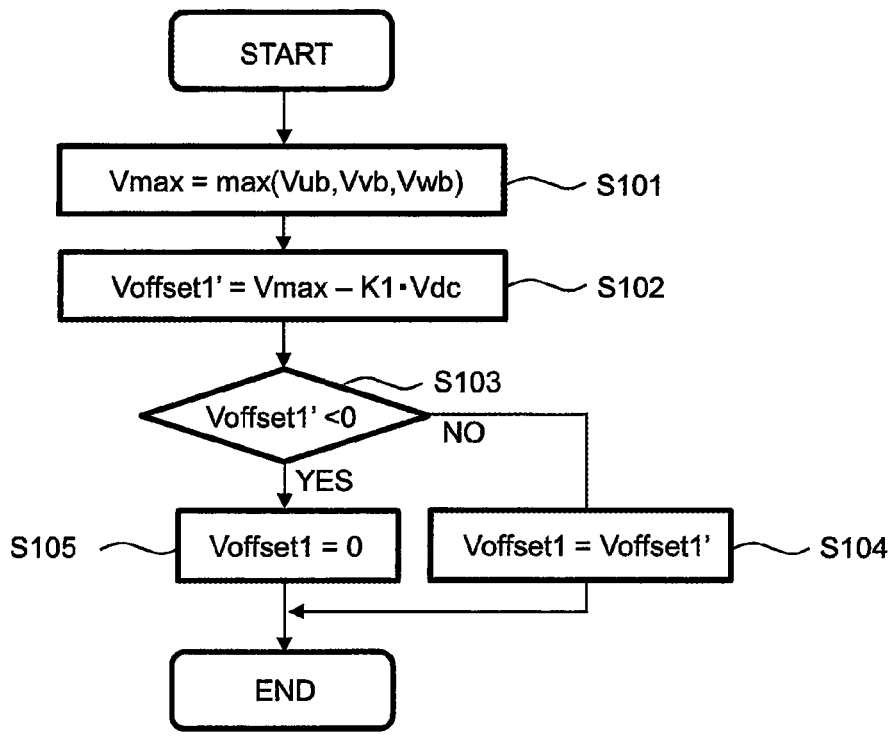
FIG. 2 is a flowchart for illustrating computation performed by a first offset voltage computing section illustrated in FIG. 1.

A first offset voltage computing section 6a computes a first offset voltage Voffset1 based on the three-phase voltage commands Vub, Vvb, and Vwb. FIG. 2 is a flowchart for illustrating the computation performed by the first offset voltage computing section 6a.

In FIG. 2, first, in Step S101, when the three-phase voltage commands Vub, Vvb, and Vwb are determined as a maximum phase, an intermediate phase, and a minimum phase in descending order, the maximum phase Vmax is computed. Subsequently, in Step S102, a first DC voltage obtained by multiplying the DC voltage Vdc by a first constant K1 is subtracted from Vmax obtained in Step S101 to compute a first offset voltage Voffset1'.

Next, in Step S103, whether a sign of the first offset voltage Voffset1' is negative or not is determined. As a result of the determination, when the sign is not negative, the processing proceeds to Step S104. When the sign is negative, the processing proceeds to Step S105. In Step S104, the first offset voltage Voffset1' is output as the first offset voltage Voffset1. Meanwhile, in Step S105, zero is output as the first offset voltage Voffset1.

Figure 3:
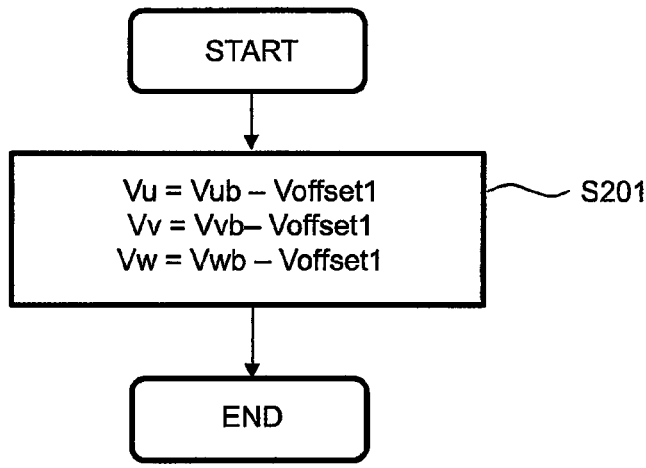
FIG. 3 is a flowchart for illustrating computation performed by a corrected three-phase voltage command computing section illustrated in FIG. 1.

A corrected three-phase voltage command computing section 7a computes the corrected three-phase voltage commands Vu, Vv, and Vw based on the three-phase voltage commands Vub, Vvb, and Vwb and the first offset voltage Voffset1. FIG. 3 is a flowchart for illustrating the computation performed by the corrected three-phase voltage command computing section 7a.

In FIG. 3, in Step S201, Voffset1 is subtracted from Vub, Vvb, and Vwb to compute Vu, Vv, and Vw, respectively.

Figure 4:
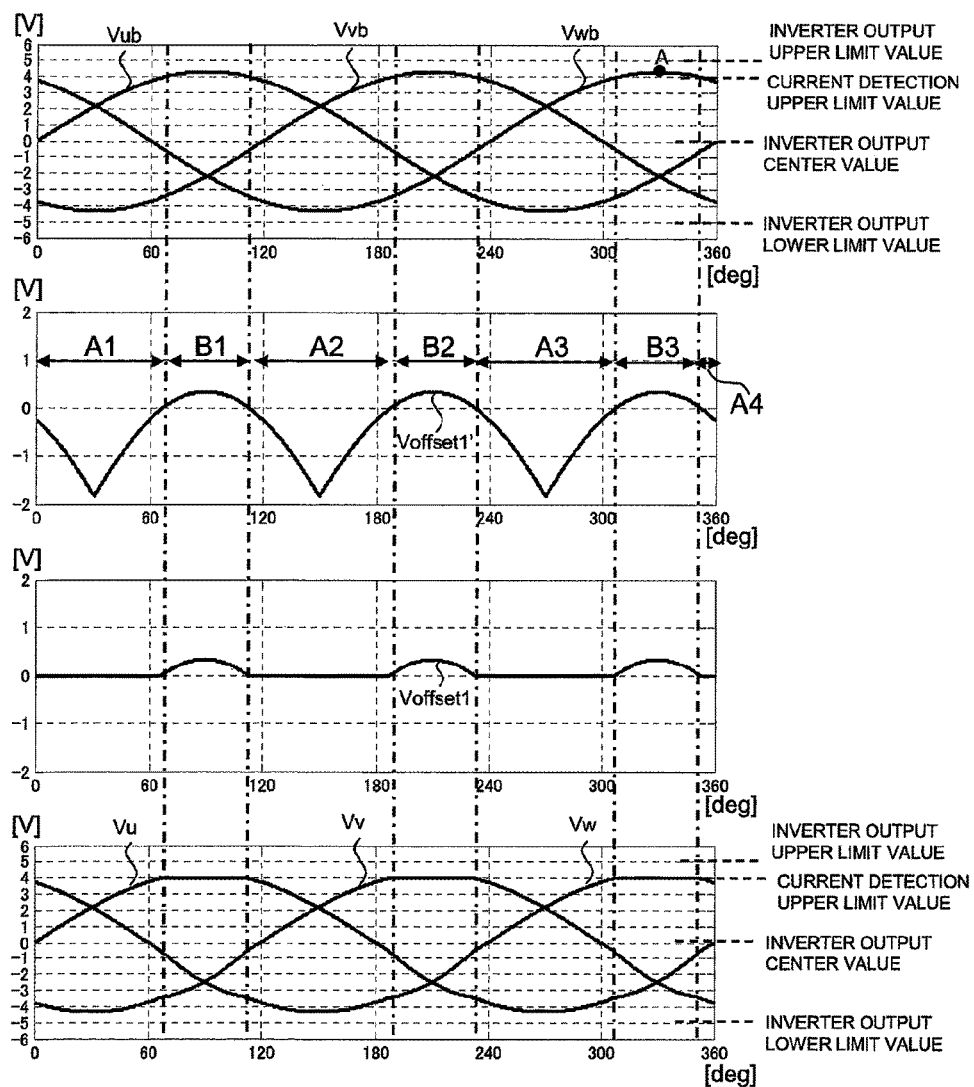
FIG. 4 is an explanatory chart for showing output waveforms from the power converter according to the first embodiment of the present invention.

FIG. 4 is an explanatory chart for showing output waveforms from the power converter according to the first embodiment of the present invention. In FIG. 4, the three-phase voltage commands Vub, Vvb, and Vwb are shown in the first part from the upper side, the first offset voltage Voffset1' is shown in the second part, the first offset voltage Voffset1 is shown in the third part, and the corrected three-phase voltage commands Vu, Vv, and Vw are shown in the fourth part.

As described above, the DC voltage Vdc is set to 10 V. Therefore, a voltage range in which the corrected three-phase voltage commands can be output without being saturated is an interval of 10 V ranging from −5 V to 5 V with −5 V being an inverter output lower limit value, 0 V being an inverter output center value, and 5 V being an inverter output upper limit value.

When a lower limit value of energization time of the lower arm switching elements Sun, Svn, and Swn that is required to detect the currents in the current detection resistive elements Ru, Rv, and Rw is set to one tenth of the carrier period Tc, for example, 5 µs in a case where Tc is 50 µs, and the corrected three-phase voltage commands Vu, Vv, and Vw fall within a 10% range below 5 V being the upper limit value of the voltage range of from −5 V to 5 V, which can be output by the inverter, specifically, within a range of from 4 V to 5 V, the energization time of the lower arm switching elements becomes insufficient. As a result, the currents cannot be detected in the current detection resistive elements Ru, Rv, and Rw.

Therefore, in order that the energization time of the lower arm switching elements may become equal to or larger than the lower limit value that enables the current detection in the current detection resistive elements Ru, Rv, and Rw, the corrected three-phase voltage commands are required to fall within a range of from −5 V being the inverter output lower limit value to 4 V being a current detection upper limit value. In view of the above, the first offset voltage Voffset1' is set so that the three-phase voltage commands Vub, Vvb, and Vwb do not exceed 4 V.

In this case, the first constant K1 is set to 0.4 so as to achieve: Voffset1'=Vmax−K1·Vdc=Vmax−4 (V). Also when the corrected three-phase voltage commands Vu, Vv, and Vw are computed by subtracting Voffset1' from the three-phase voltage commands Vub, Vvb, and Vwb, respectively, the voltage of the maximum phase among the corrected three-phase voltage commands Vu, Vv, and Vw is constantly corrected to 4 V. Thus, the currents can be detected.

Even when Vmax is 4 V or smaller to make the sign of Voffset1' negative, however, Vmax is undesirably offset. Specifically, even in intervals A1, A2, A3, and A4 shown in FIG. 4, Vmax is offset. In the above-mentioned intervals, Vmax is smaller than 4 V. Therefore, the maximum phase of the corrected three-phase voltage commands does not exceed 4 V, and hence the currents can be detected in the current detection resistive elements even without offset.

Therefore, when the sign of Voffset1' is negative, Voffset1' is corrected to 0, and the value 0 is set as Voffset1. Then, through subtraction of Voffset1 from each of the three-phase voltage commands Vub, Vvb, and Vwb, the energization time of the lower arm switching element of the maximum phase is corrected only in intervals B1, B2, and B3, in which the offset is required for the current detection, so as to be equal to the lower limit value, which enables the current detection in the current detection resistive elements.

In the other intervals A1, A2, A3, and A4, the three-phase voltage commands Vub, Vvb, and Vwb are output directly as the corrected three-phase voltage commands Vu, Vv, and Vw. Therefore, in the intervals A1, A2, A3, and A4, an average value of the corrected three-phase voltage commands Vu, Vv, and Vw becomes equal to the inverter output center value, and a neutral voltage becomes equal to half of a capacitor voltage. Consequently, as described in Patent Literature 2, an effect of reducing noise and vibration is obtained in the above-mentioned intervals.

Next, effects in comparison to those of Patent Literature 1 and Patent Literature 2 are further described. In Patent Literature 1, three-phase modulation and two-phase modulation are switched in accordance with an amplitude value of the inverter output voltages. In this case, an amplitude value of the three-phase voltage commands is expressed by Expression (1). When the three-phase voltage commands Vub, Vvb, and Vwb shown in the first part of FIG. 4 are assigned, the amplitude value is 4.33 V, and is a constant value over all the intervals in FIG. 4.

$$V_{amp} = \sqrt{\frac{2}{3}(V_{ub}^2 + V_{vb}^2 + V_{wb}^2)} \qquad (1)$$

The value is equal to a value at a point A indicated by the solid circle in the first part of FIG. 4, specifically, a peak value of the three-phase voltage commands. Thus, the amplitude value exceeds 4 V. Therefore, in consideration of the lower limit value of the energization time of the lower arm switching elements with which the currents cannot be detected when the amplitude value exceeds 4 V, the two-phase modulation is required to be selected for all the intervals in FIG. 4, with the result that the noise and the vibration are increased.

Further, also in Patent Literature 2, the modification factor is used merely in place of the amplitude value in Patent Literature 1. Therefore, for the three-phase voltage commands shown in the first part of FIG. 4, lower solid two-phase modification is required to be selected in consideration of ensuring of the energization time of the lower arm switching elements.

Meanwhile, in the present invention, the interval in which the maximum phase exceeds 4 V in instantaneous value and therefore the offset is required is determined in Step S103 of FIG. 2. When the offset is not required (Voffset1'<0), the first offset voltage Voffset1 is corrected to zero for Voffset1' (≠0) in Step S105, and is set as a final first offset voltage.

The interval for which the offset is required means, when the three-phase voltage commands Vub, Vvb, and Vwb are output directly as the corrected three-phase voltage commands Vu, Vv, and Vw, a region in which the energization time of the lower arm switching elements is smaller than the lower limit value, which enables the current detection in the current detection resistive elements, and therefore the maximum phase voltage of the corrected three-phase voltage commands is required to be set to 4 V or smaller.

By the processing described above, the first offset voltage Voffset1 can be set to zero in the intervals A1, A2, A3, and A4 of FIG. 4. As a result, the average value of the corrected three-phase voltage commands Vu, Vv, and Vw becomes equal to the inverter output center value, and the neutral voltage becomes equal to the half of the capacitor voltage.

As described above, the two-phase modification is required to be selected for all the intervals in FIG. 4 according to the methods of Patent Literature 1 and Patent Literature 2. In contrast, in the present invention, the first offset voltage is subtracted only for the intervals B1, B2, and B3. Therefore, an output voltage distortion, the noise, and the vibration are reduced as compared to those in Patent Literature 1 and Patent Literature 2. Further, as is understood from the waveforms of the corrected three-phase voltage commands Vu, Vv, and Vw shown in FIG. 4, a discontinuous voltage change does not occur in the first embodiment. Therefore, the output voltage distortion, the noise, and the vibration are reduced as compared to those in Patent Literature 1 and Patent Literature 2.

Further, when energization time of upper arm switching elements that enables the current detection in the current detection resistive elements Ru, Rv, and Rw is to be ensured to be a lower limit value or larger in a case where the current detection resistive elements Ru, Rv, and Rw are provided in series to the upper arm elements Sup, Svp, and Swp of the inverter 3, respectively, the corrected three-phase voltage commands are required to fall within a range of from −4 V being the current detection lower limit value to 5 V being the inverter output upper limit value.

Therefore, a third offset voltage Voffset3' is set so that the three-phase voltage commands Vub, Vvb, and Vwb do not become smaller than −4 V being the lower limit value, which enables the current detection in the current detection resistive elements. In this case, a fourth constant K4 is set to 0.4 to obtain: Voffset3'=Vmin+K4·Vdc=Vmin+4 (V).

Then, when a sign of Voffset3' is positive, Voffset3' is corrected to 0. When the sign is negative, Voffset3' is output directly. A value of Voffset3' is set as Voffset3, and Voffset3 is then subtracted from the three-phase voltage commands Vub, Vvb, and Vwb. In this manner, the same effects as those obtained in the above-mentioned case where the current detection resistive elements Ru, Rv, and Rw are provided in series to the lower arm switching elements Sun, Svn, and Swn of the inverter 3, respectively, are obtained.

As described above, according to the first embodiment, when the three-phase voltage commands are determined as the maximum phase, the intermediate phase, and the minimum phase in descending order, the first offset voltage computing section computes the first offset voltage by subtracting the first DC voltage, which has been calculated by multiplying the DC voltage by the first constant, from the maximum phase. Then, when the first offset voltage has the negative sign, the first offset voltage computing section sets the first offset voltage to zero. The corrected three-phase voltage command computing section subtracts the first offset voltage from each phase of the three-phase voltage commands to output the corrected three-phase voltage commands.

In this manner, a range in which the three-phase modification is available can be increased, while the discontinuous voltage change does not occur when the modification system is switched. Therefore, distortion factors of the output voltages can be reduced, while the noise and the vibration can be reduced.

Second Embodiment

Figure 5:
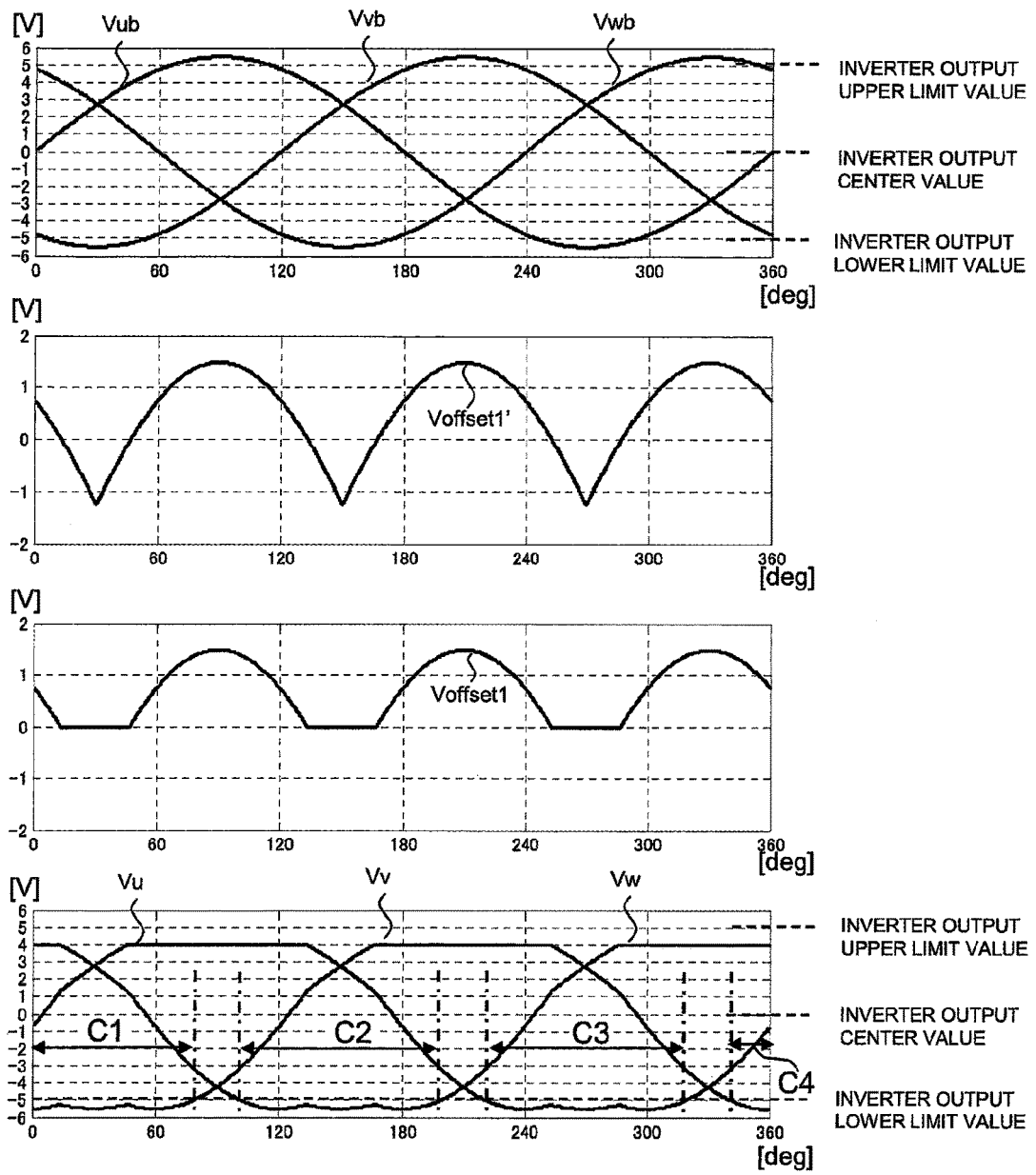
FIG. 5 is an explanatory chart for showing the output waveforms obtained when an amplitude value of three-phase voltage commands shown in FIG. 4 is increased.

The three-phase voltage commands Vub, Vvb, Vwb, the first offset voltage Voffset1', the first offset voltage Voffset1, and the corrected three-phase voltage commands Vu, Vv, and Vw obtained when, in comparison to FIG. 4, in which the amplitude value of the three-phase voltage commands is 4.33 V in the first embodiment described above, the amplitude value of the three-phase voltage commands is increased to 5.48 V are shown in FIG. 5.

In FIG. 5, in intervals C1, C2, C3, and C4, the smallest value of the corrected three-phase voltage commands is smaller than −5 V being the inverter lower limit value, which results in voltage saturation. When the voltage saturation occurs, there is a problem in that the output voltage distortion, the noise, and the vibration are increased. A second embodiment of the present invention is now described. A description overlapping with that of the first embodiment is herein omitted.

Figure 6:
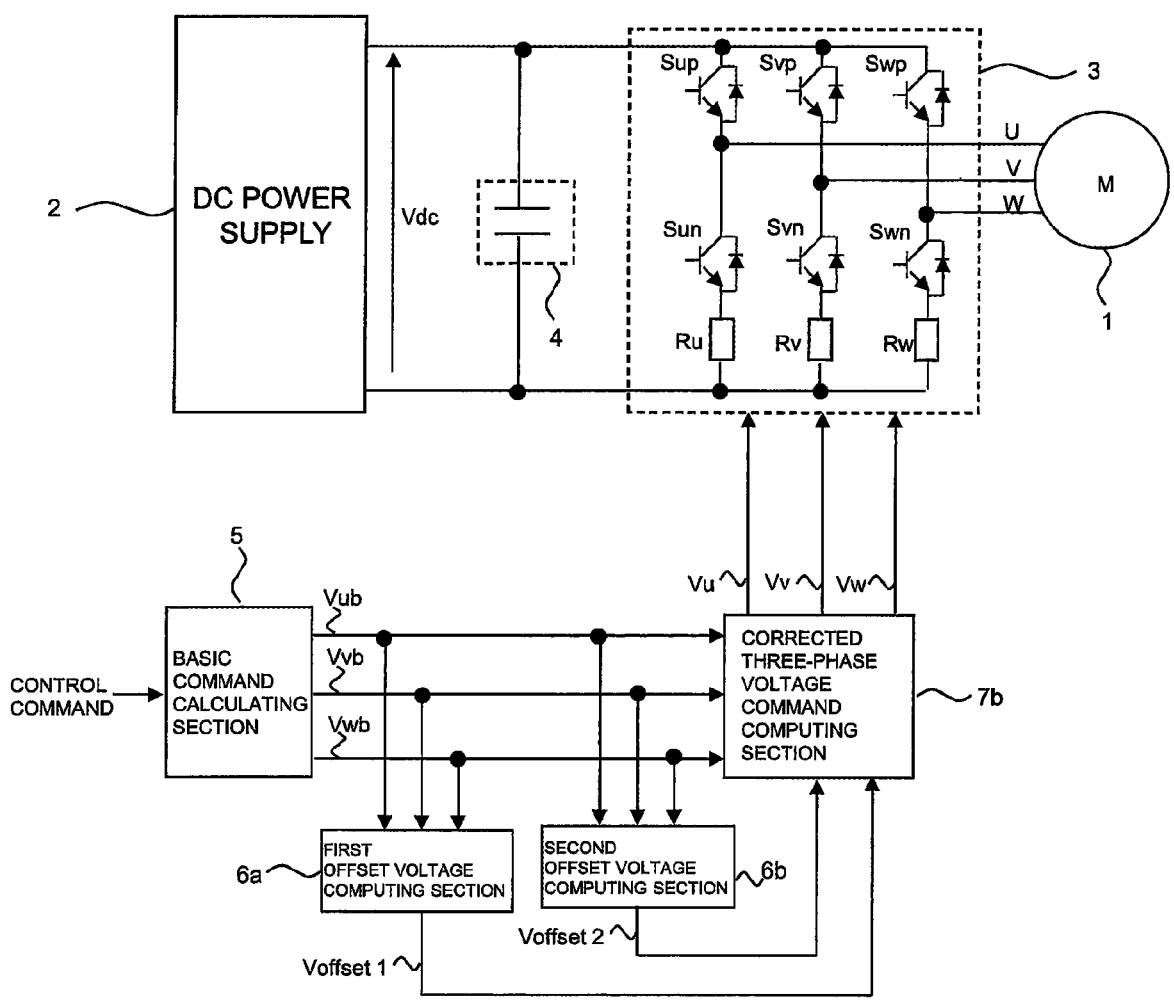
FIG. 6 is an overall configuration diagram for illustrating a power converter according to a second embodiment of the present invention.

FIG. 6 is an overall configuration diagram for illustrating a power converter according to the second embodiment of the present invention. The second embodiment differs from the first embodiment in a second offset voltage computing section 6b and a corrected three-phase voltage command computing section 7b.

Figure 7:
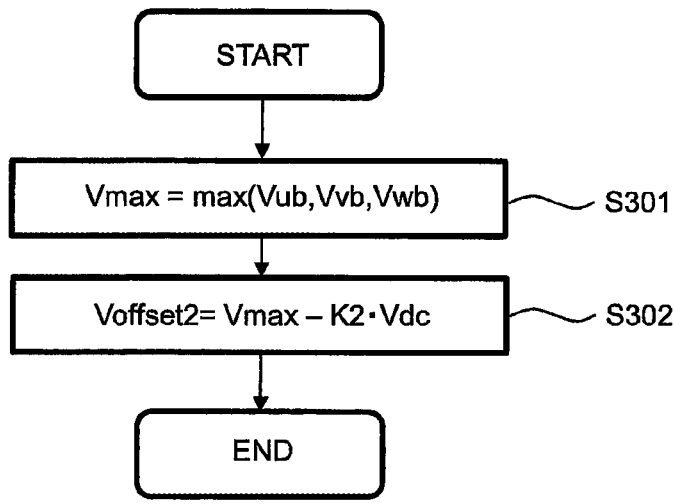
FIG. 7 is a flowchart for illustrating computation performed by a second offset voltage computing section illustrated in FIG. 6.

The second offset voltage computing section 6b computes a second offset voltage Voffset2 based on the three-phase voltage commands Vub, Vvb, and Vwb. FIG. 7 is a flowchart for illustrating the computation performed by the second offset voltage computing section 6b.

In FIG. 7, first, in Step S301, the maximum phase Vmax being the largest voltage among Vub, Vvb, and Vwb is computed. Subsequently, in Step S302, a second DC voltage obtained by multiplying the DC voltage Vdc by a second constant K2 is subtracted from Vmax obtained in Step S301 to compute the second offset voltage Voffset2.

The second constant is determined so that the value calculated by multiplying K2 and Vdc becomes equal to the inverter output upper limit value. For example, when Vdc is equal to 10 V and the inverter output upper limit value is equal to 5 V, K2 is determined to be 0.5.

Figure 8:
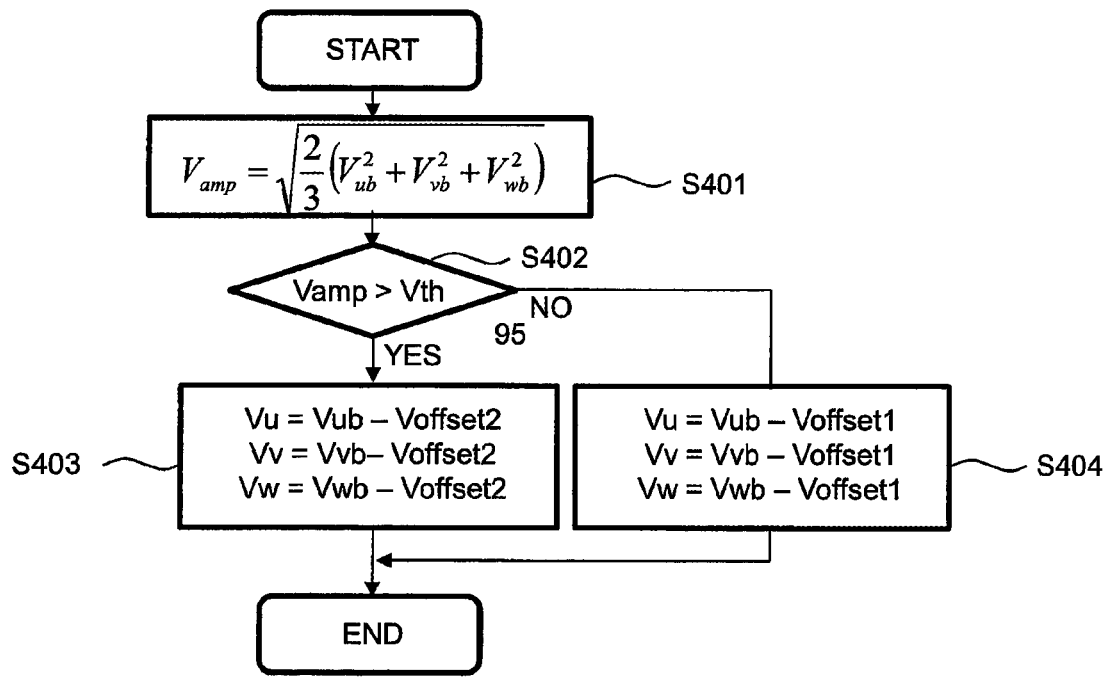
FIG. 8 is a flowchart for illustrating computation performed by a corrected three-phase voltage command computing section illustrated in FIG. 6.

The corrected three-phase voltage command computing section 7b computes the corrected three-phase voltage commands Vu, Vv, and Vw based on the three-phase voltage commands Vub, Vvb, and Vwb, the first offset voltage Voffset1, and the second offset voltage Voffset2. FIG. 8 is a flowchart for illustrating the computation performed by the corrected three-phase voltage command computing section 7b.

In FIG. 8, first, in Step S401, an amplitude value Vamp of the three-phase voltage commands is calculated by Expression (1). Subsequently, in Step S402, whether the amplitude value Vamp is larger than an amplitude threshold value Vth is determined. In this case, Vth is set to a value that can prevent the smallest phase of the corrected three-phase voltage commands shown in FIG. 5 from becoming smaller than the inverter output lower limit value. For example, Vth is set to 0.5 times as large as Vdc, specifically, when Vdc is 10 V, Vth is set to about 5 V.

As a result of the determination, when Vamp is larger than the amplitude threshold value Vth, the processing proceeds to Step S403. When Vamp is smaller than the amplitude threshold value Vth, the processing proceeds to Step S404.

In Step S403, Voffset2 is subtracted from Vub, Vvb, and Vwb to compute Vu, Vv, and Vw, respectively. Meanwhile, in Step S404, Voffset1 is subtracted from Vub, Vvb, and Vwb to compute Vu, Vv, and Vw, respectively.

Figure 9:
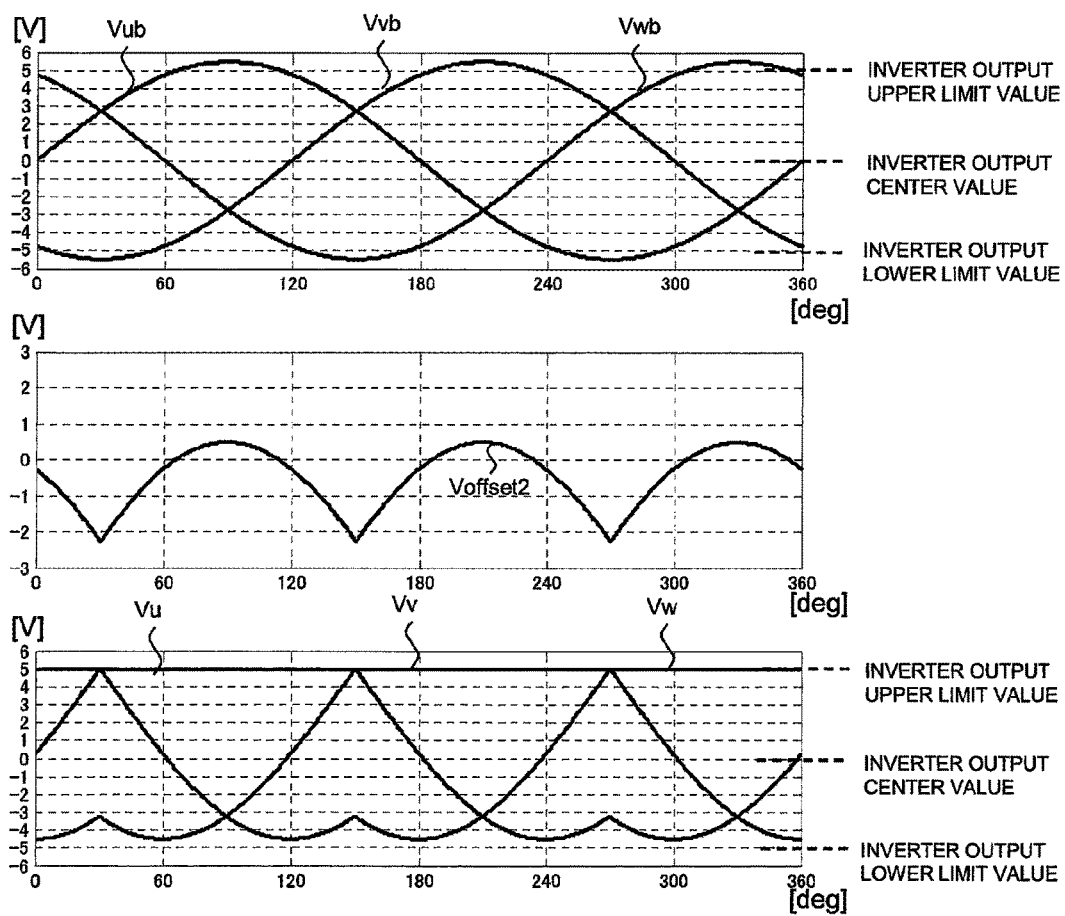
FIG. 9 is an explanatory chart for showing output waveforms from the power converter according to the second embodiment of the present invention.

FIG. 9 is an explanatory chart for showing output waveforms from the power converter according to the second embodiment of the present invention. In FIG. 9, the three-phase voltage commands Vub, Vvb, and Vwb, which are obtained when the amplitude value Vamp is set to 5.48 V as in FIG. 5, are shown in the first part from the upper side, the second offset voltage Voffset2 is shown in the second part, and the corrected three-phase voltage commands Vu, Vv, and Vw are shown in the third part. In FIG. 9, Vth is 5 V, and it is assumed that "YES" is selected in the processing in Step S402.

As can be seen from FIG. 9, there is not observed a phenomenon in which the smallest value of the corrected three-phase voltage commands becomes smaller than the inverter output lower limit value, which is seen in FIG. 5, and the corrected three-phase voltage commands fall within the range of the inverter output. Thus, even when the amplitude is large, the voltage saturation can be prevented.

As described above, in the second embodiment, the second offset voltage computing section is provided so as to output the second offset voltage, which has been obtained by subtracting the second DC voltage calculated by multiplying the DC voltage by the second constant from the maximum phase, when the amplitude of the three-phase voltage commands is larger than the threshold value. As a result, in addition to the effects of the first embodiment, the voltage saturation can be prevented even when the amplitude of the three-phase voltage commands is large. Thus, the output voltage distortion, the noise, and the vibration can be reduced.

It is apparent that the same effects are obtained even when the corrected three-phase voltage commands are calculated based on the first offset voltage in the intervals C1, C2, C3, and C4 in FIG. 5 and the corrected three-phase voltage commands are calculated based on the second offset voltage in the other intervals.

Further, when the current detection resistive elements Ru, Rv, and Rw are provided in series to the upper arm switching elements Sup, Svp, and Swp of the inverter 3, respectively, and the amplitude value exceeds the amplitude threshold value Vth, first, a fifth DC voltage calculated by multiplying the DC voltage Vdc by a fifth constant K5 is subtracted from Vmax to compute a fourth offset voltage Voffset4.

Subsequently, the corrected three-phase voltage commands Vu, Vv, and Vw are obtained by subtracting the fourth offset voltage Voffset4 from the three-phase voltage commands Vub, Vvb, Vwb. As a result, even when the amplitude of the three-phase voltage commands is large, the voltage saturation can be prevented. In this case, the fifth constant is determined so that the value calculated by multiplying K5 and Vdc becomes equal to the inverter output upper limit value. For example, when Vdc is equal to 10 V and the inverter output upper limit value is equal to 5 V, K5 is set to 0.5.

Third Embodiment

Now, a third embodiment of the present invention is described. A description overlapping with those of the first embodiment and the second embodiment is omitted. The third embodiment differs from the second embodiment in the second offset voltage computing section 6b.

Figure 10:
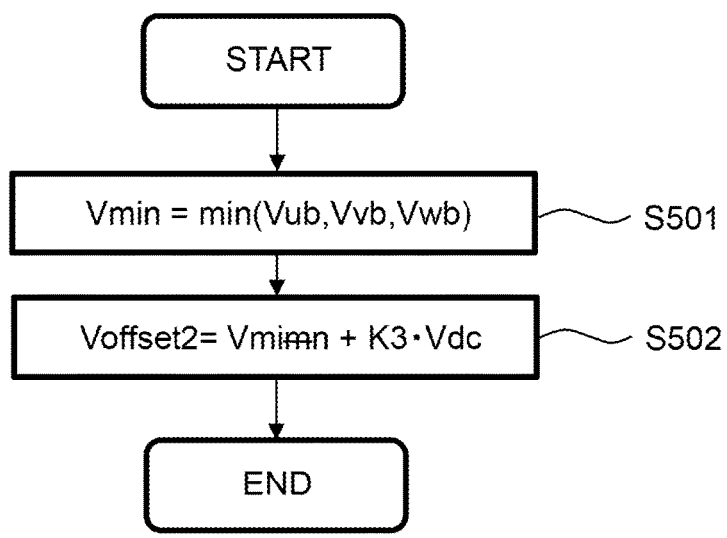
FIG. 10 is a flowchart for illustrating computation performed by a second offset voltage computing section in a power converter according to a third embodiment of the present invention.

The second offset voltage computing section 6b computes the second offset voltage Voffset2 based on the three-phase voltage commands Vub, Vvb, and Vwb. FIG. 10 is a flowchart for illustrating the computation performed by the second offset voltage computing section 6b.

In FIG. 10, first, in Step S501, a minimum phase Vmin being the smallest voltage among Vub, Vvb, and Vwb is computed. Subsequently, in Step S502, a third DC voltage obtained by multiplying the DC voltage Vdc by a third constant K3 is added to Vmin obtained in Step S501 to compute the second offset voltage Voffset2.

The third constant is determined so that a sign-inverted value of the value calculated by multiplying K3 and Vdc becomes equal to the inverter output lower limit value. For example, when Vdc is equal to 10 V and the inverter output lower limit value is equal to −5 V, K3 is determined to be 0.5.

Figure 11:
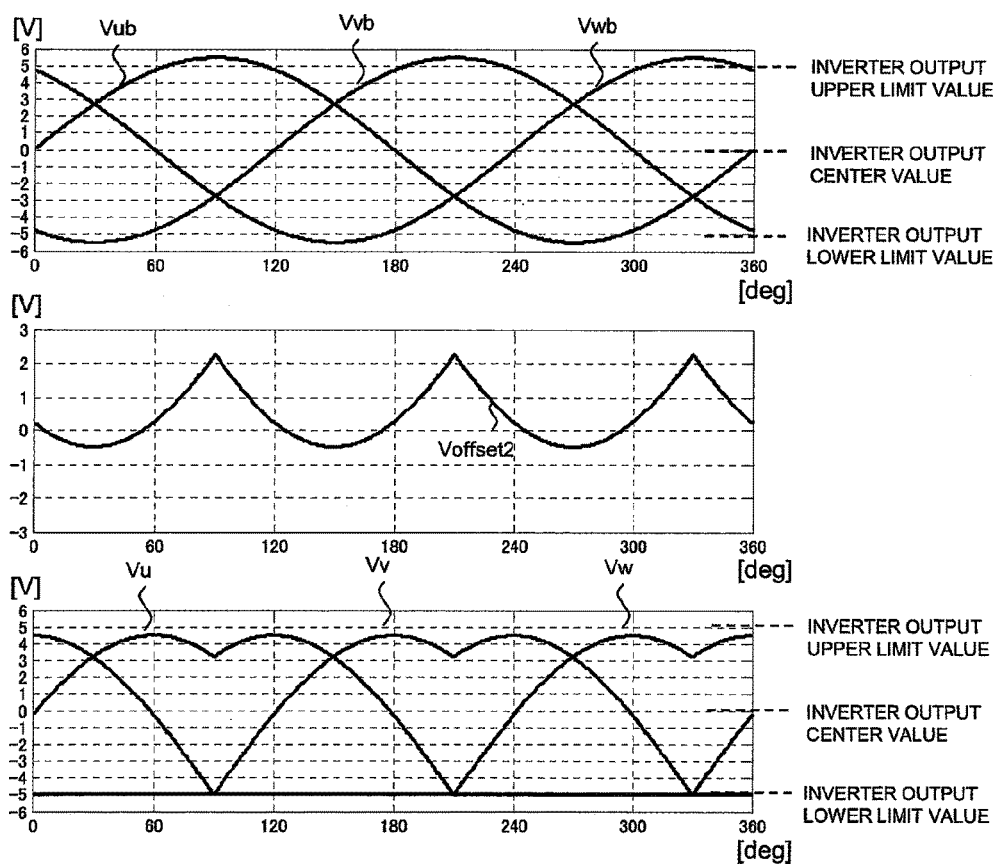
FIG. 11 is an explanatory chart for showing output waveforms from the power converter according to the third embodiment of the present invention.

FIG. 11 is an explanatory chart for showing output waveforms from the power converter according to the third embodiment of the present invention. In FIG. 11, the three-phase voltage commands Vub, Vvb, and Vwb, which are obtained when the amplitude value Vamp is set to 5.48 V as in FIG. 5, are shown in the first part from the upper side, the second offset voltage Voffset2 is shown in the second part, and the corrected three-phase voltage commands Vu, Vv, and Vw are shown in the third part. In FIG. 11, Vth is 5 V, and it is assumed that "YES" is selected in the processing in Step S402 in FIG. 8.

As can be seen from FIG. 11, similarly to FIG. 9 referred to in the second embodiment, the corrected three-phase voltage commands fall within the range of the inverter output. Therefore, even when the amplitude is large, the voltage saturation can be prevented.

As described above, in the third embodiment, the second offset voltage computing section is provided so as to output the second offset voltage, which has been obtained by adding the third DC voltage calculated by multiplying the DC voltage by the third constant to the minimum phase, when the amplitude of the three-phase voltage commands is larger than the threshold value. As a result, similarly to the second embodiment, the voltage saturation can be prevented even when the amplitude of the three-phase voltage commands is large. Thus, the output voltage distortion, the noise, and the vibration can be reduced.

It is apparent that the same effects are obtained even when the corrected three-phase voltage commands are calculated based on the first offset voltage in the intervals C1, C2, C3, and C4 in FIG. 5 and the corrected three-phase voltage commands are calculated based on the second offset voltage in the other intervals.

Further, when the current detection resistive elements Ru, Rv, and Rw are provided in series to the upper arm switching elements Sup, Svp, and Swp of the inverter 3, respectively, and the amplitude value exceeds the amplitude threshold value Vth, first, a sixth DC voltage calculated by multiplying the DC voltage Vdc by a sixth constant K6 is added to Vmin to compute the fourth offset voltage Voffset4.

Subsequently, the corrected three-phase voltage commands Vu, Vv, and Vw are obtained by subtracting the fourth offset voltage Voffset4 from the three-phase voltage commands Vub, Vvb, Vwb. As a result, even when the amplitude of the three-phase voltage commands is large, the voltage saturation can be prevented. In this case, the sixth constant is determined so that the sign-inverted value of the value calculated by multiplying K6 and Vdc becomes equal to the inverter output lower limit value. For example, when Vdc is equal to 10 V and the inverter output lower limit value is equal to −5 V, K6 is set to 0.5.

Fourth Embodiment

Now, a fourth embodiment of the present invention is described. A description overlapping with those of the first embodiment to the third embodiment is omitted. The fourth embodiment differs from the second embodiment in the second offset voltage computing section 6b.

Figure 12:
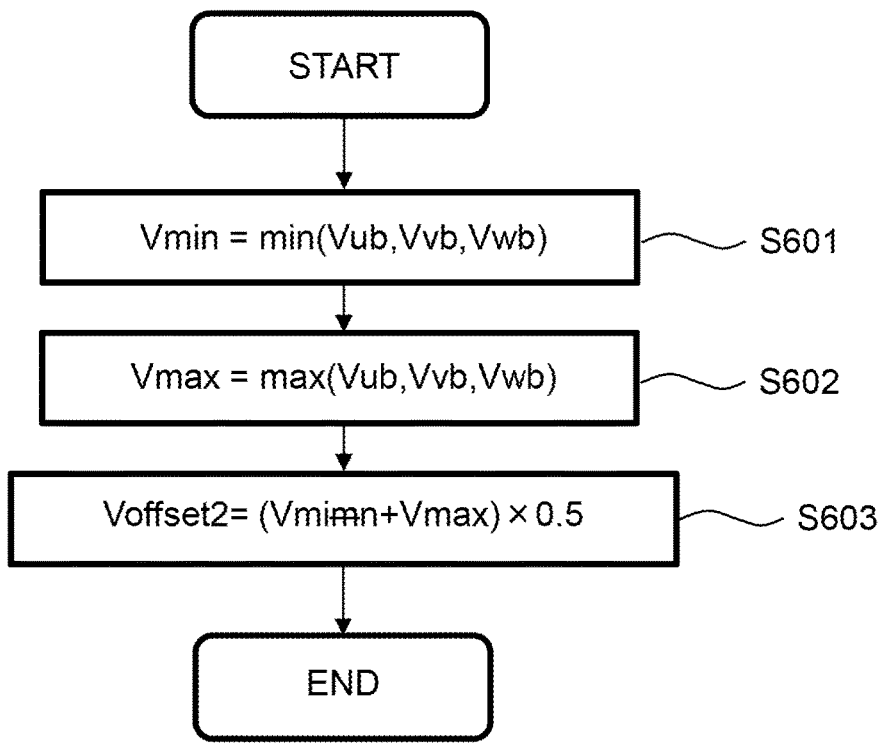
FIG. 12 is a flowchart for illustrating computation performed by a second offset voltage computing section in a power converter according to a fourth embodiment of the present invention.

The second offset voltage computing section 6b computes the second offset voltage Voffset2 based on the three-phase voltage commands Vub, Vvb, and Vwb. FIG. 12 is a flowchart for illustrating the computation performed by the second offset voltage computing section 6b.

In FIG. 12, first, in Step S601, the minimum phase Vmin being the smallest voltage among Vub, Vvb, and Vwb is computed. Subsequently, in Step S602, the maximum phase Vmax being the largest voltage among Vub, Vvb, and Vwb is computed. Next, in Step S603, the second offset voltage Voffset2 is computed by obtaining an average value of Vmin and Vmax.

Figure 13:
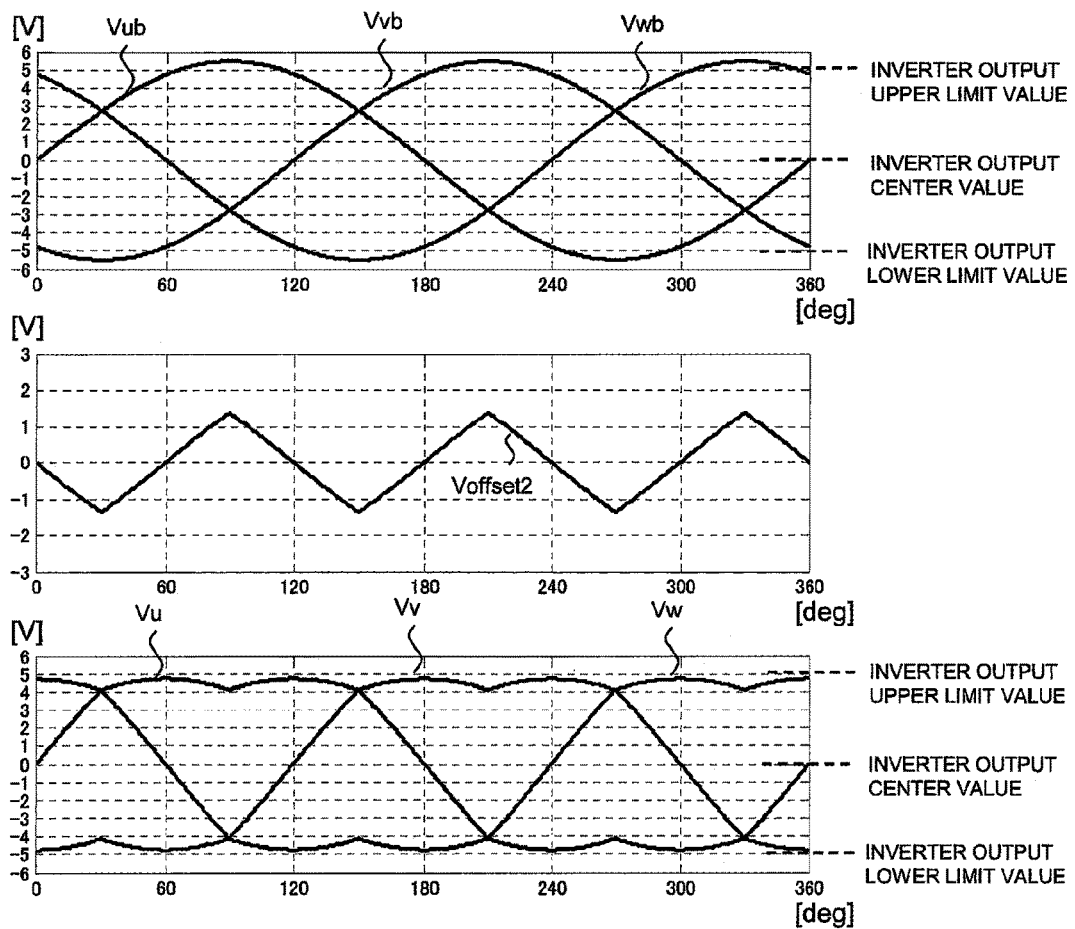
FIG. 13 is an explanatory chart for showing output waveforms from the power converter according to the fourth embodiment of the present invention.

FIG. 13 is an explanatory chart for showing output waveforms from the power converter according to the fourth embodiment of the present invention. In FIG. 13, the three-phase voltage commands Vub, Vvb, and Vwb, which are obtained when the amplitude value Vamp is set to 5.48 V as in FIG. 5, are shown in the first part from the upper side, the second offset voltage Voffset2 is shown in the second part, and the corrected three-phase voltage commands Vu, Vv, and Vw are shown in the third part. In FIG. 13, Vth is 5 V, and it is assumed that "YES" is selected in the processing in Step S402 in FIG. 8.

As can be seen from FIG. 13, similarly to FIG. 9 referred to in the second embodiment, the corrected three-phase voltage commands fall within the range of the inverter output. Therefore, even when the amplitude is large, the voltage saturation can be prevented.

As described above, in the fourth embodiment, the second offset voltage computing section is provided so as to output the second offset voltage obtained by averaging the minimum phase and the maximum phase when the amplitude of the three-phase voltage commands is larger than the threshold value. As a result, similarly to the second embodiment, even when the amplitude of the three-phase voltage commands is large, the voltage saturation can be prevented. Thus, the output voltage distortion, the noise, and the vibration can be reduced.

It is apparent that the same effects are obtained even when the corrected three-phase voltage commands are calculated based on the first offset voltage in the intervals C1, C2, C3, and C4 in FIG. 5 and the corrected three-phase voltage commands are calculated based on the second offset voltage in the other intervals.

Further, when the current detection resistive elements Ru, Rv, and Rw are provided in series to the upper arm switching elements Sup, Svp, and Swp of the inverter 3, respectively, and the amplitude value exceeds the amplitude threshold value Vth, first, the fourth offset voltage Voffset4 is computed by the average value of Vmin and Vmax.

Subsequently, the corrected three-phase voltage commands Vu, Vv, and Vw are obtained by subtracting the fourth offset voltage Voffset4 from the three-phase voltage commands Vub, Vvb, Vwb. As a result, even when the amplitude of the three-phase voltage commands is large, the voltage saturation can be prevented.

According to the second to fourth embodiments described above, the second offset voltage Voffset2 is computed based on at least two of the maximum phase Vmax, the minimum phase Vmin, and the DC voltage Vdc. When the amplitude value Vamp of the three-phase voltage commands is larger than the threshold value Vth, the second offset voltage is subtracted from the three-phase voltage commands. With this configuration, even when the amplitude of the three-phase voltage commands is large, the voltage saturation can be prevented. Thus, the output voltage distortion, the noise, and the vibration can be reduced.

Further, according to the second to fourth embodiments described above, the fourth offset voltage Voffset4 is computed based on at least two of the maximum phase Vmax, the minimum phase Vmin, and the DC voltage Vdc. When the amplitude value Vamp of the three-phase voltage commands is larger than the threshold value Vth, the fourth offset voltage Voffset4 is subtracted from the three-phase voltage commands. With this configuration, even when the amplitude of the three-phase voltage commands is large, the voltage saturation can be prevented. Thus, the output voltage distortion, the noise, and the vibration can be reduced.

Fifth Embodiment

Figure 14:
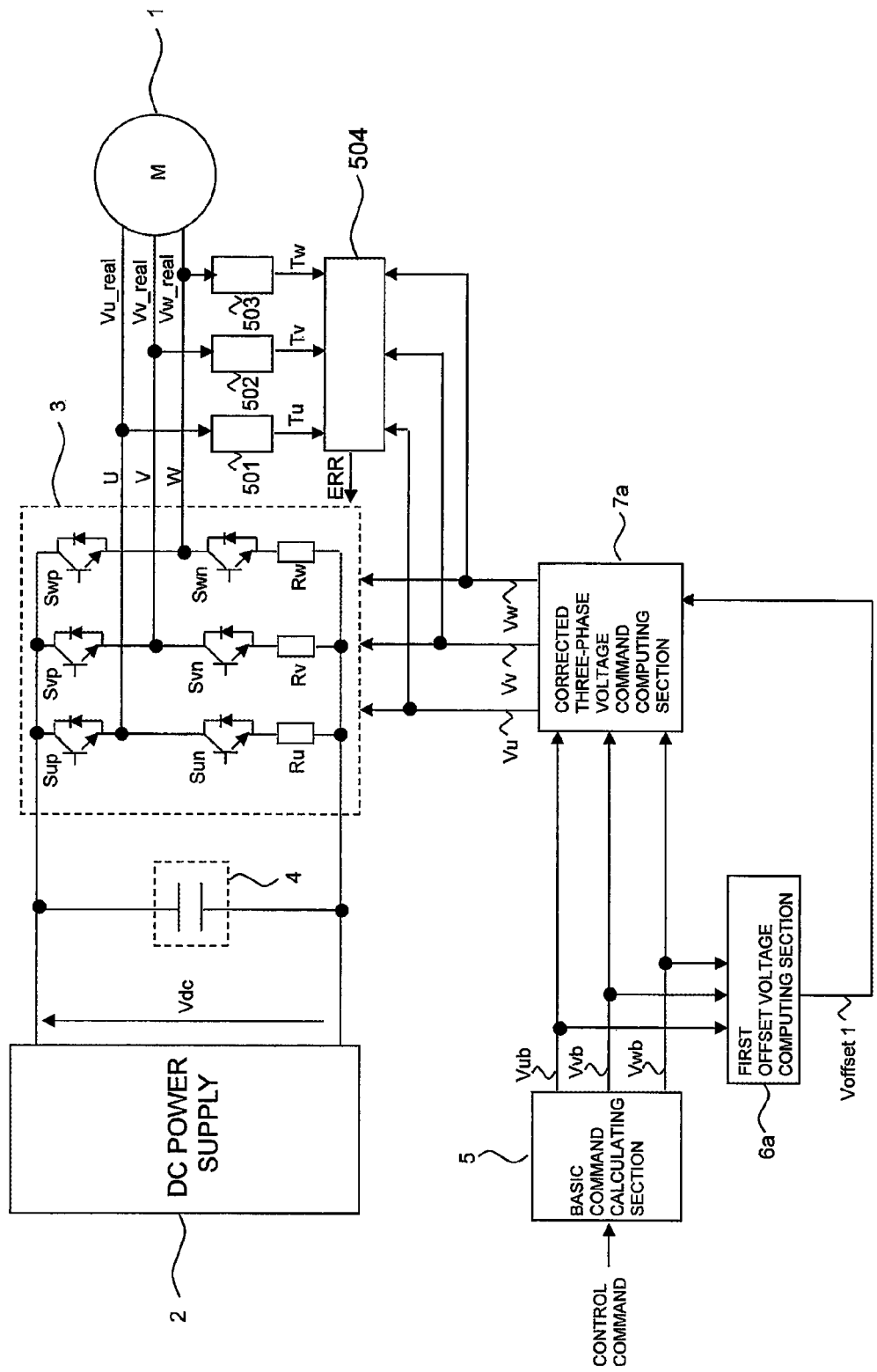
FIG. 14 is an overall configuration diagram for illustrating a power converter according to a fifth embodiment of the present invention.

Now, a fifth embodiment of the present invention is described. A description overlapping with that of the first embodiment is omitted. FIG. 14 is an overall configuration diagram for illustrating a power converter according to the fifth embodiment of the present invention. The fifth embodiment differs from the first embodiment in output voltage detection circuits 501, 502, and 503, and an inverter failure detection section 504.

The output voltage detection circuit 501 is a circuit, to which a U-phase voltage Vu_real of three-phase voltages Vu_real, Vv_real, and Vw_real, which are output from the inverter 3, is input, and which outputs an ON time Tu of Vu_real. The output voltage detection circuit 502 is a circuit, to which the V-phase voltage Vv_real of the three-phase voltages Vu_real, Vv_real, and Vw_real, which are output from the inverter 3, is input, and which outputs an ON time Tv of Vv_real.

The output voltage detection circuit 503 is a circuit, to which the W-phase voltage Vw_real of the three-phase voltages Vu_real, Vv_real, and Vw_real, which are output from the inverter 3, is input, and which outputs an ON time Tw of Vw_real. The ON time is time of connection to the upper arm switching element, and an OFF time is time of connection to the lower arm switching element.

Figure 15:
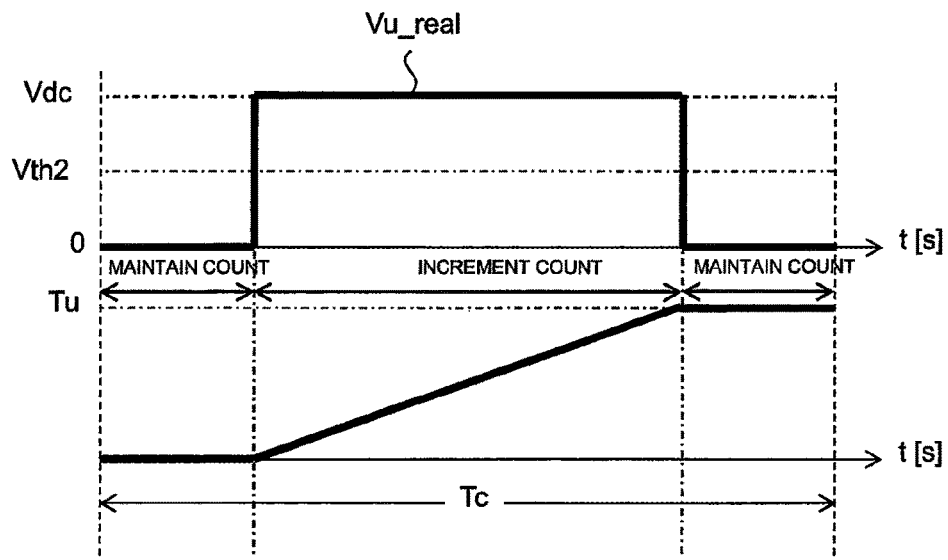
FIG. 15 is an explanatory chart for showing an operation of an output voltage detection circuit illustrated in FIG. 14.

An operation of the output voltage detection circuit 501 is now described referring to FIG. 15. FIG. 15 is an explanatory chart for showing an operation of the output voltage detection circuit illustrated in FIG. 14. Operations of the output voltage detection circuits 502 and 503 are the same as that of the output voltage detection circuit 501, and therefore a description thereof is omitted herein.

A waveform in the upper part of FIG. 15 is a waveform of Vu_real. The U-phase voltage Vu_real has a PWM waveform in the carrier period Tc. The U-phase voltage Vu_real is connected to the switching element Sun to output 0 V in an OFF period, and is connected to the switching element Sup to output Vdc (V) in an ON period.

A threshold value Vth2, which satisfies: $0<Vth2<Vdc$, is set for the output voltage detection circuit 501. When Vu_real is larger than Vth2, a count is incremented. When Vu_real is smaller than Vth2, the count is maintained. In FIG. 15, the ON time Tu is counted, and is output to the inverter failure detection section 504.

Figure 16:
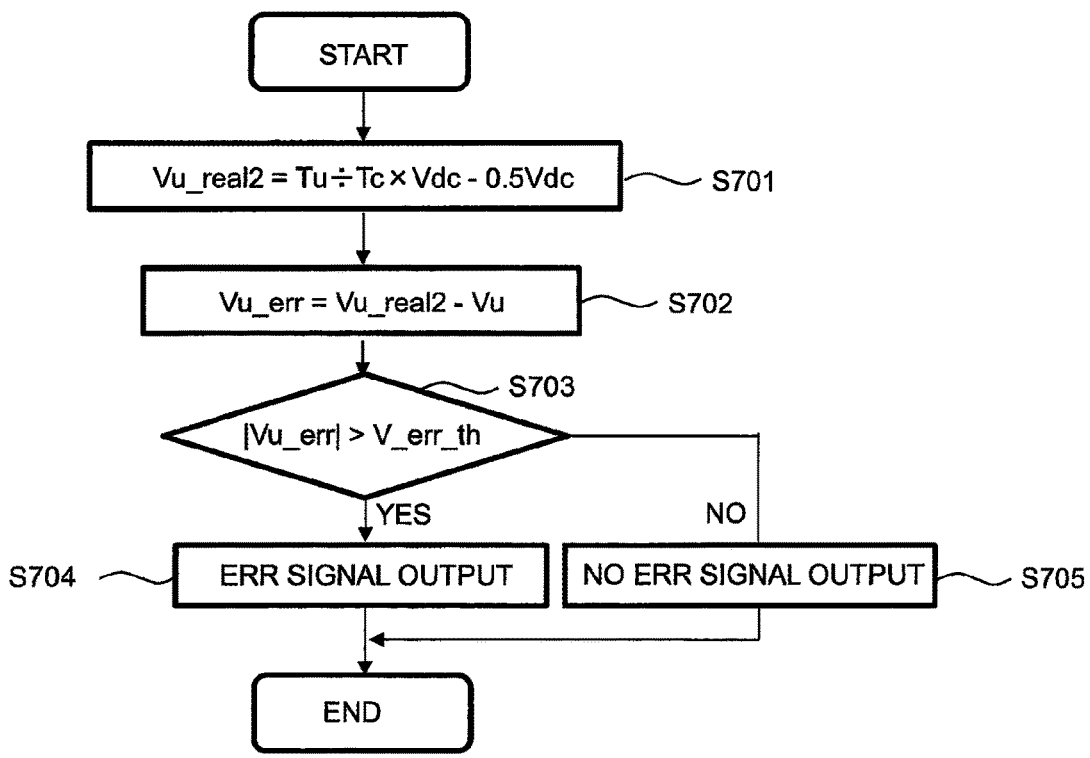
FIG. 16 is a flowchart for illustrating an operation of an inverter failure detection section illustrated in FIG. 14.

Next, an operation of the inverter failure detection section 504 is described with reference to FIG. 16. FIG. 16 is a flowchart for illustrating the operation of the inverter failure detection section 504.

In FIG. 16, first, in Step S701, a U-phase output voltage Vu_real2 is calculated by: Tu/Tc×Vdc−0.5Vdc with use of the ON time Tu output from the output voltage detection circuit 501, the carrier period Tc, and the DC voltage Vdc. Subsequently, in Step S702, Vu output from the corrected three-phase voltage command computing section 7a is subtracted from Vu_real2 obtained in Step S701 to compute a U-phase voltage error Vu_err.

Next, in Step S703, it is determined whether an absolute value |Vu_err| of the U-phase voltage error Vu_err obtained in Step S702 is larger than an error reference value V_err_th. In this case, the error reference value V_err_th is set to a value with some margin in consideration that there is an error due to deadtime or the like between the corrected three-phase voltage commands and the voltages actually output from the inverter 3.

In Step S703, when larger (YES) is selected, an ERR signal is output, and the inverter 3 is stopped. Meanwhile, when not larger (NO) is selected, the ERR signal is not output.

Although the case of U-phase has been described above, an absolute value |Vv_err| of a V-phase voltage error and an absolute value |Vw_err| of a W-phase voltage error are computed based on a V-phase ON time Tv and a W-phase ON time Tw for the V-phase and the W-phase, respectively. Each of the absolute values is compared with the error reference value V_err_th. When the absolute value is larger than the error reference value V_err_th, a signal for stopping the inverter 3 is output.

Next, effects of the fifth embodiment are described. With the methods described in Patent Literature 1 and Patent Literature 2, when the three-phase voltage commands exceed the current detection upper limit value, the modulation system is required to be switched to the two-phase modulation. Therefore, the largest phase of the corrected three-phase voltage commands is equal to the inverter output upper limit value. As a result, one of the three-phase voltages Vu_real, Vv_real, and Vw_real is constantly equal to Vdc. Consequently, a short-to-power failure in which the three-phase voltages Vu_real, Vv_real, and Vw_real stay at Vdc independently of the values of the corrected three-phase voltage commands cannot be distinguished therefrom.

Meanwhile, in the first embodiment (FIG. 4), when the three-phase voltage commands exceed the current detection upper limit value, the first offset voltage Voffset1 is set so that the largest phase of the corrected three-phase voltage commands becomes equal to the current detection upper limit value. The first offset voltage Voffset1 is smaller than the inverter output upper limit value. Therefore, an OFF interval in which Vu_real becomes zero is inevitably generated in the carrier period Tc shown in FIG. 15, and Tu, Tv, and Tw have a value smaller than Tc. Consequently, even when the maximum phase of the three-phase voltage commands exceeds the current detection upper limit value, the short-to-power failure can be distinguished therefrom.

Further, the current detection resistive elements Ru, Rv, and Rw are provided in series to the upper arm switching elements Sup, Svp, and Swp of the inverter 3, respectively. At the same time, when the three-phase voltage commands become smaller than the current detection lower limit value, the third offset voltage Voffset3 is set so that the smallest phase of the corrected three-phase voltage commands becomes equal to the current detection lower limit value.

The third offset voltage Voffset3 is larger than the inverter output lower limit value. Therefore, an ON interval in which Vu_real becomes equal to Vdc is inevitably generated in the carrier period Tc shown in FIG. 15, and Tu, Tv, and Tw have a value larger than zero. Consequently, even when the amplitude value in the minimum phase of the three-phase voltage commands falls below the current detection lower limit value, a short-to-ground failure in which the three-phase voltages Vu_real, Vv_real, and Vw_real stay at zero independently of the values of the corrected three-phase voltage commands can be distinguished therefrom.

As described above, with the configuration of the fifth embodiment, even when the amplitude of the three-phase voltage commands is large, a striking effect of enabling the distinction of the short-to-power failure and the short-to-ground failure, which has not hitherto been obtained, is achieved.

Sixth Embodiment

Figure 17:
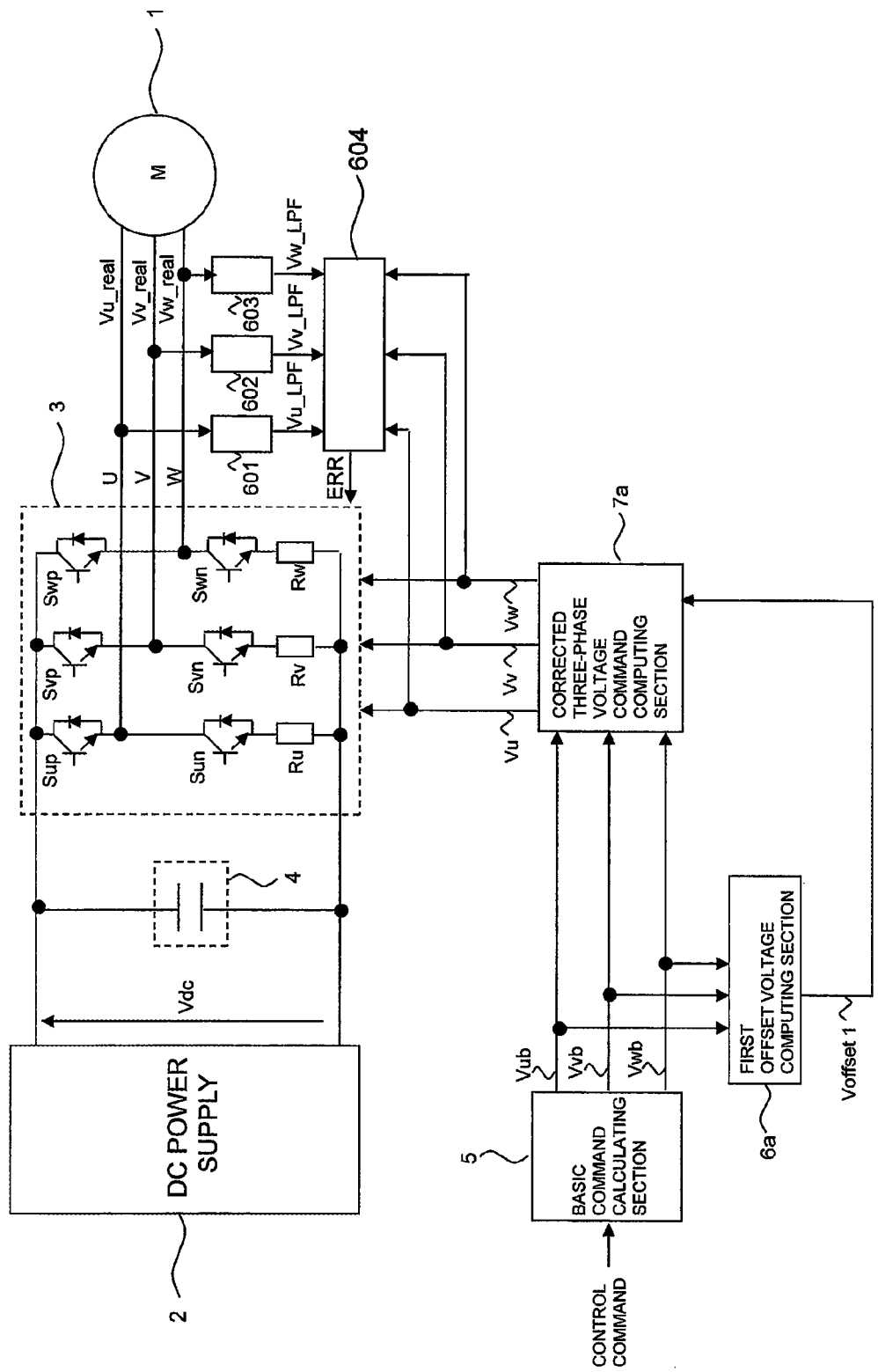
FIG. 17 is an overall configuration diagram for illustrating a power converter according to a sixth embodiment of the present invention.

Now, a sixth embodiment of the present invention is described. A description overlapping with that of the first embodiment is omitted. FIG. 17 is an overall configuration diagram for illustrating a power converter according to the sixth embodiment of the present invention. The sixth embodiment differs from the first embodiment in output voltage detection circuits 601, 602, and 603, and an inverter failure detection section 604.

Figure 18:
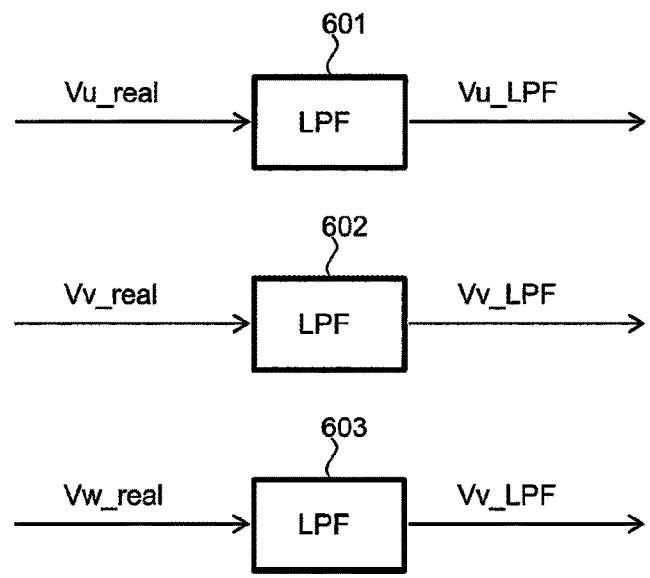
FIG. 18 is a configuration diagram for illustrating an output voltage detection circuit illustrated in FIG. 17.

Now, with reference to FIG. 18, operations of the output voltage detection circuits 601, 602, and 603 are described. FIG. 18 is a configuration diagram for illustrating the output voltage detection circuits illustrated in FIG. 17. In FIG. 18, the output voltage detection circuits 601, 602, and 603 are low-pass filters (LPFs).

To the output voltage detection circuit 601, Vu_real of the three-phase voltages Vu_real, Vv_real, and Vw_real output from the inverter 3 is input. The output voltage detection circuit 601 then outputs a voltage Vu_LPF obtained by removing a carrier frequency component from Vu_real. In this case, the carrier frequency component is a carrier wave component, and is an inverse number of the carrier period Tc.

To the output voltage detection circuit 602, Vv_real of the three-phase voltages Vu_real, Vv_real, and Vw_real output from the inverter 3 is input. The output voltage detection circuit 602 then outputs a voltage Vv_LPF obtained by removing the carrier frequency component from Vv_real.

To the output voltage detection circuit 603, Vw_real of the three-phase voltages Vu_real, Vv_real, and Vw_real output from the inverter 3 is input. The output voltage detection circuit 603 then outputs a voltage Vw_LPF obtained by removing the carrier frequency component from Vw_real.

Figure 19:
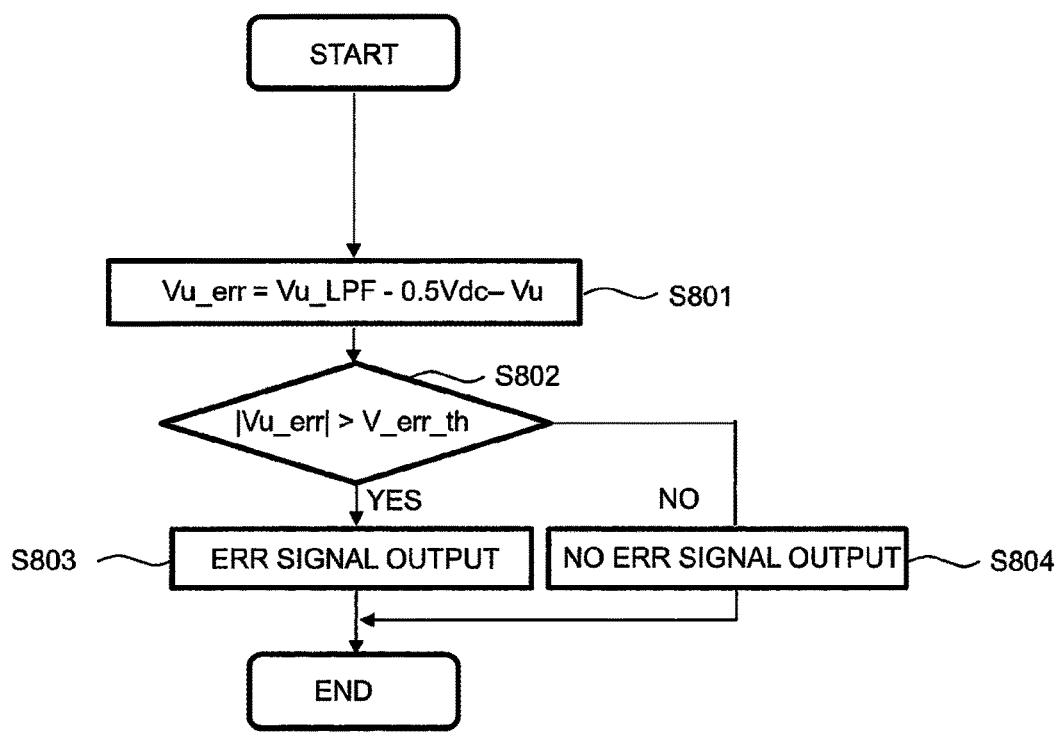
FIG. 19 is a flowchart for illustrating an operation of an inverter failure detection section illustrated in FIG. 17.

Next, an operation of the inverter failure detection section 604 is described with reference to FIG. 19. FIG. 19 is a flowchart for illustrating the operation of the inverter failure detection section 604.

In FIG. 19, first, in Step S801, Vu output from the corrected three-phase voltage command computing section 7a and 0.5×Vdc are subtracted from Vu_LPF obtained in the output voltage detection circuit 601 to compute the U-phase voltage error Vu_err. Subsequently, in Step S802, whether the absolute value |Vu_err| of the U-phase voltage error Vu_err obtained in Step S801 is larger than the error reference value V_err_th is determined.

In Step S802, when larger (YES) is selected, an ERR signal is output, and the inverter 3 is stopped. Meanwhile, when not larger (NO) is selected, the ERR signal is not output.

Although the case of U-phase has been described above, an absolute value |Vv_err| of a V-phase voltage error and an absolute value |Vw_err| of a W-phase voltage error are computed based on Vv_LPF and Vw_LPF for the V-phase and the W-phase, respectively. Each of the absolute values is compared with the error reference value V_err_th. When the absolute value is larger than the error reference value V_err_th, a signal for stopping the inverter 3 is output.

Next, effects of the sixth embodiment are described. With the methods described in Patent Literature 1 and Patent Literature 2, when the three-phase voltage commands exceed the current detection upper limit value, the modulation system is required to be switched to the two-phase modulation. Therefore, the largest phase of the corrected three-phase voltage commands is equal to the inverter output upper limit value. Therefore, one of the three-phase voltages Vu_real, Vv_real, and Vw_real is constantly equal to Vdc. As a result, a short-to-power failure in which the three-phase voltages Vu_real, Vv_real, and Vw_real stay at Vdc independently of the values of the corrected three-phase voltage commands cannot be distinguished therefrom.

Meanwhile, in the first embodiment (FIG. 4), when the three-phase voltage commands exceed the current detection upper limit value, the first offset voltage Voffset1 is set so that the largest phase of the corrected three-phase voltage commands becomes equal to the current detection upper limit value. Thus, Vu_LPF, Vv_LPF, and Vw_LPF have a value smaller than the DC voltage Vdc. Therefore, the short-to-power failure can be distinguished.

As described above, with the configuration of the sixth embodiment, even when the amplitude of the three-phase voltage commands is large, a striking effect of enabling the distinction of the short-to-power failure, which has not hitherto been obtained, is achieved.

Seventh Embodiment

Figure 20:
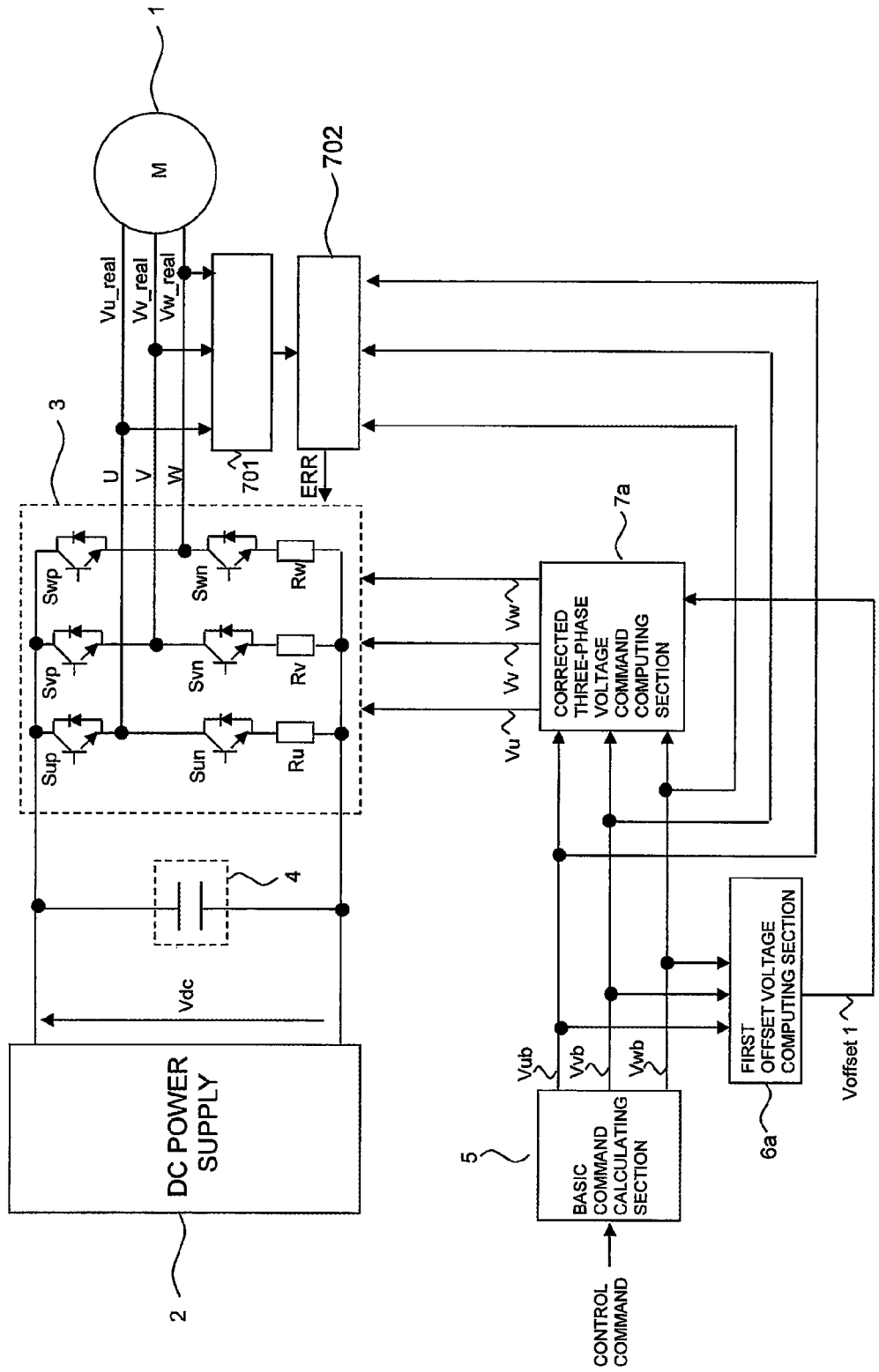
FIG. 20 is an overall configuration diagram for illustrating a power converter according to a seventh embodiment of the present invention.

Now, a seventh embodiment of the present invention is described. A description overlapping with that of the first embodiment is omitted. FIG. 20 is an overall configuration diagram for illustrating a power converter according to the seventh embodiment of the present invention. The seventh embodiment differs from the first embodiment in an output voltage detection circuit 701 and an inverter failure detection section 702.

Figure 21:
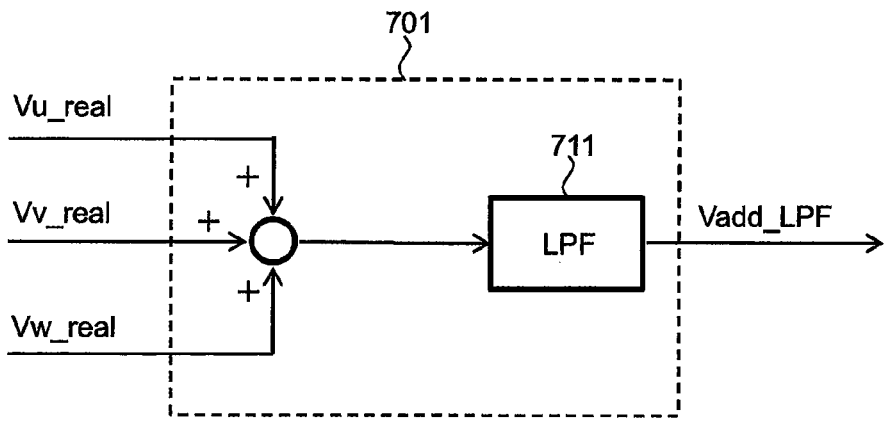
FIG. 21 is a configuration diagram for illustrating an output voltage detection circuit illustrated in FIG. 20.

Now, with reference to FIG. 21, the operation of the output voltage detection circuit 701 is described. FIG. 21 is a configuration diagram for illustrating the output voltage detection circuit illustrated in FIG. 20. In FIG. 21, the output voltage detection circuit 701 includes a low-pass filter (LPF) 711.

After detecting the three-phase voltages Vu_real, Vv_real, and Vw_real output from the inverter 3, the output voltage detection circuit 701 adds the voltages of all the phases, and then outputs a voltage Vadd_LPF obtained by removing the carrier frequency component from the voltage obtained by the addition using the low-pass filter (LPF) 711. In this case, the carrier frequency component is a carrier wave component, and is the inverse number of the carrier period Tc.

Figure 22:
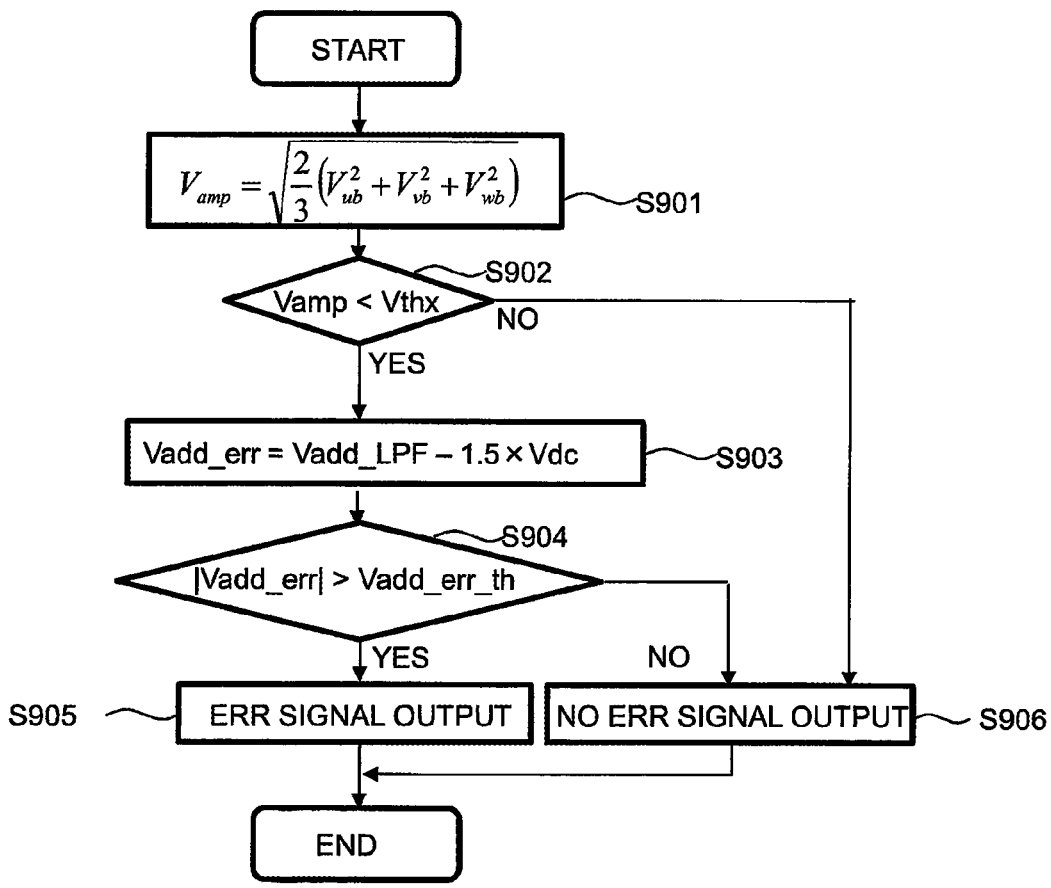
FIG. 22 is a flowchart for illustrating an operation of an inverter failure detection section illustrated in FIG. 20.

Next, an operation of the inverter failure detection section 702 is described with reference to FIG. 22. FIG. 22 is a flowchart for illustrating the operation of the inverter failure detection section 702.

In FIG. 22, first, in Step S901, the amplitude value Vamp of the three-phase voltage commands is calculated by Expression (1). Subsequently, in Step S902, whether the amplitude value Vamp is larger than an amplitude threshold value Vthx is determined. In this case, Vthx is set so that, even when the three-phase voltage commands are output directly as the corrected three-phase voltage commands, the maximum phase becomes equal to or smaller than a current detection condition value.

Next, when YES is selected in Step S902, a value calculated by subtracting 1.5×Vdc from Vadd_LPF in Step S901 is obtained as an addition value error Vadd_err. Subsequently, in Step S904, it is determined whether an absolute value |Vadd_err| of the addition value error Vadd_err obtained in Step S903 is larger than an addition value error reference value Vadd_err_th.

In Step S904, when larger (YES) is selected, an ERR signal is output, and the inverter 3 is stopped. Meanwhile, when not larger (NO) is selected, the ERR signal is not output.

Figure 23:
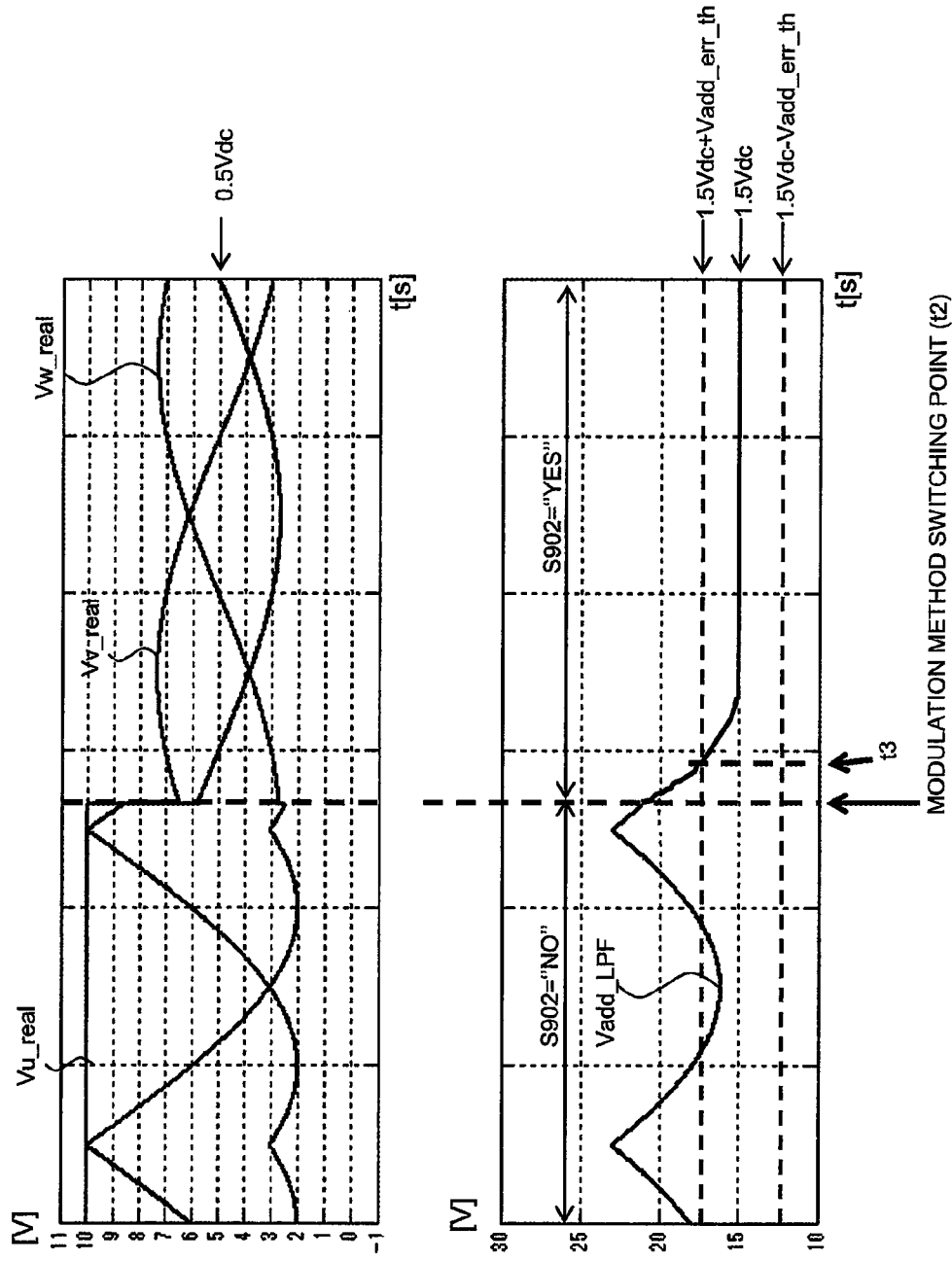
FIG. 23 is an explanatory chart for showing output waveforms from a related-art power converter.

With reference to FIG. 23, a problem that may be caused in a case where the output voltage detection circuit 701 and the inverter failure detection section 702 are applied to the systems of Patent Literature 1 and Patent Literature 2 is now described. FIG. 23 is an explanatory chart for showing output waveforms from a related-art power converter.

In FIG. 23, in the upper part, waveforms of the three-phase voltages Vu_real, Vv_real, and Vw_real are shown. Before a time t2, the two-phase modulation is used. In the lower part, a waveform of Vadd_LPF is shown.

Further, in a region on the left side of the modulation method switching point (t2), the amplitude value Vamp is larger than Vthx, and therefore NO is selected as a result of the processing in Step S902 of FIG. 22. Meanwhile, in a region on the right side of the time t2, the amplitude value Vamp is smaller than Vthx, and therefore YES is selected as the result of the processing in Step S902 of FIG. 22.

When the amplitude value Vamp decreases in a stepwise fashion at the time t2, the processing in Step S902 is switched from NO to YES in a stepwise fashion to execute the processing in Step S903 to Step S906. The voltage Vadd_LPF has a response lag generated due to the low-pass filter processing illustrated in FIG. 21, and therefore does not instantaneously become equal to 1.5Vdc at the time t2, and exceeds 1.5Vdc+Vadd_err_th in an interval from the time t2 to a time t3.

As a result, |Vadd_err| exceeds Vadd_err_th through Steps S903 and S904 of FIG. 22. Thus, the ERR signal is undesirably output to the inverter 3 in the processing in Step S905. Consequently, the inverter 3 is stopped although a failure does not occur in the inverter 3 in practice.

Figure 24:
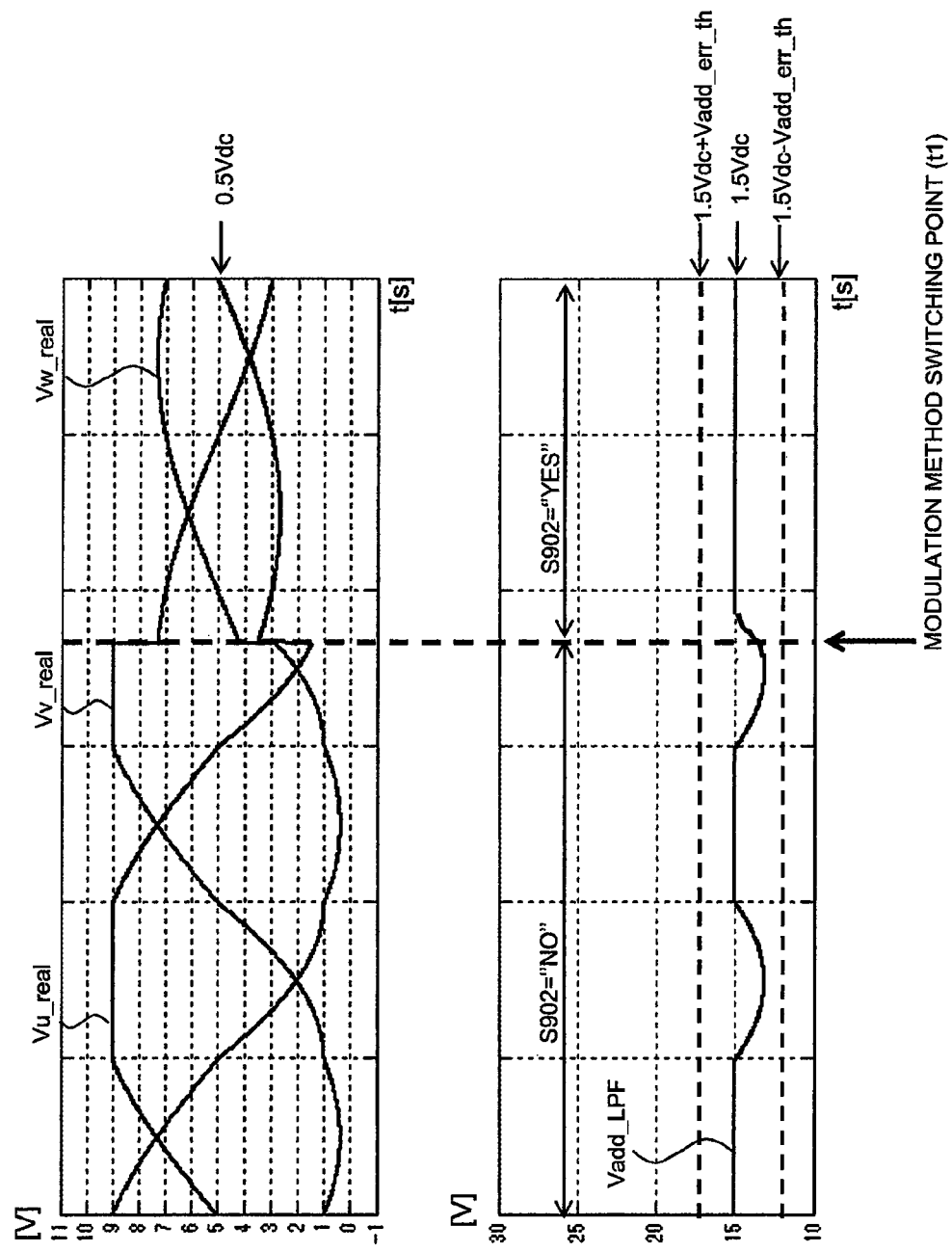
FIG. 24 is an explanatory chart for showing output waveforms from the power converter according to the seventh embodiment of the present invention.

Subsequently, with reference to FIG. 24, effects of the seventh embodiment are described. FIG. 24 is an explanatory chart for showing output waveforms from the power converter according to the seventh embodiment of the present invention.

In FIG. 24, in the upper part, waveforms of the three-phase voltages Vu_real, Vv_real, and Vw_real are shown. The amplitude is the same as that in the upper part of FIG. 23. The maximum phase of the three-phase voltage commands Vub, Vvb, and Vwb is larger than the current detection upper limit value before a time t1, and is smaller after the time t1.

In this case, in the first embodiment (FIG. 4), when the three-phase voltage commands exceed the current detection upper limit value, the first offset voltage Voffset1 is set so that the largest phase of the corrected three-phase voltage commands becomes equal to the current detection upper limit value. Therefore, before the time t1, the voltage Vadd_LPF has a fluctuation smaller than that before the time t2 in FIG. 23, and falls within a range of from 1.5Vdc−Vadd_err_th to 1.5Vdc+Vadd_err_th.

Accordingly, even when the amplitude value changes in a stepwise fashion at the time t1, Vadd_LPF is not present out of the range of from 1.5Vdc−Vadd_err_th to 1.5Vdc+Vadd_err_th. Thus, |Vadd_err| is smaller than Vadd_err_th, and hence the processing in Step S906 is always executed. Therefore, the signal for stopping the inverter 3 is not output.

As described above, with the configuration of the seventh embodiment, a striking effect of preventing erroneous detection of the failure of the inverter even when the amplitude of the three-phase voltage commands fluctuates steeply from a large value to a small value, which has not hitherto obtained, is achieved.

The present invention is receptive of modifications, within the scope of the present invention, in which the embodiments are combined freely, or modified or omitted suitably.

The invention claimed is:

1. A power converter, which is configured to convert a DC voltage into three-phase voltages based on three-phase voltage commands each of the three-phase voltage commands being a sine wave to output the three-phase voltages,
the power converter comprising:
a first offset voltage computing section, which is configured to compute, when the three-phase voltage commands are determined as a maximum phase, an intermediate phase, and a minimum phase in descending order, a first offset voltage by subtracting a first DC voltage calculated by multiplying the DC voltage by a first constant from the maximum phase, and to set the first offset voltage to zero when a sign of the first offset voltage is negative;
a corrected three-phase voltage command computing section, which is configured to subtract the first offset voltage from each phase of the three-phase voltage commands to output corrected three-phase voltage commands; and
an inverter, which is configured to output the three-phase voltages based on the corrected three-phase voltage commands.

2. The power converter according to claim 1,
wherein the inverter includes a current detector, which is configured to detect currents flowing through phases of the inverter based on a voltage drop in current detection resistive elements connected in series to lower arm switching elements, and
wherein the first offset voltage computing section is configured to set the first constant so that energization time of the lower arm switching elements becomes equal to a lower limit value that enables detection of the currents in the current detection resistive elements.

3. The power converter according to claim 1, further comprising a second offset voltage computing section, which is configured to compute a second offset voltage based on at least two of the maximum phase, the minimum phase, and the DC voltage,
wherein the corrected three-phase voltage command section is configured to output, when an amplitude of the three-phase voltage commands is larger than a preset threshold value, the corrected three-phase voltage commands obtained by subtracting the second offset voltage from the three-phase voltage commands.

4. The power converter according to claim 3,
wherein the second offset voltage computing section is configured to compute the second offset voltage by subtracting a second DC voltage calculated by multiplying the DC voltage by a second constant from the maximum phase, and
wherein the second constant is set so that a voltage of a largest phase of the three-phase voltages output from the inverter becomes equal to a preset upper limit value.

5. The power converter according to claim 3,
wherein the second offset voltage computing section is configured to compute the second offset voltage by adding a third DC voltage calculated by multiplying the DC voltage by a third constant to the minimum phase, and
wherein the third constant is set so that a voltage of a smallest phase of the three-phase voltages output from the inverter becomes equal to a preset lower limit value.

6. The power converter according to claim 3, wherein the second offset voltage computing section is configured to obtain an average value of the maximum phase and the minimum phase as the second offset voltage.

7. The power converter according to claim 1, further comprising output voltage detection circuits, which are configured to detect the three-phase voltages output from the inverter, for the phases,
wherein the power converter is configured to determine a failure of the inverter based on the three-phase voltages.

8. The power converter according to claim 7, wherein the power converter is configured to determine the failure of the inverter based on the three-phase voltages obtained by removing a carrier wave component from the three-phase voltages detected by the output voltage detection circuits.

9. The power converter according to claim 7, wherein the power converter is configured to determine the failure of the inverter when an addition value of the three-phase voltages for the respective phases, which is obtained by removing a carrier wave component from the three-phase voltages detected by the output voltage detection circuits, deviates from a preset threshold value.

10. A power converter, which is configured to convert a DC voltage into three-phase voltages based on three-phase voltage commands each of the three-phase voltage commands being a sine wave to output the three-phase voltages,
the power converter comprising:
a third offset voltage computing section, which is configured to compute, when the three-phase voltage commands are determined as a maximum phase, an intermediate phase, and a minimum phase in descending order, a third offset voltage by adding a fourth DC voltage calculated by multiplying the DC voltage by a fourth constant to the minimum phase, and to set the third offset voltage to zero when a sign of the third offset voltage is positive;
a corrected three-phase voltage command computing section, which is configured to subtract the third offset voltage from each phase of the three-phase voltage commands to output corrected three-phase voltage commands; and
an inverter, which is configured to output the three-phase voltages based on the corrected three-phase voltage commands.

11. The power converter according to claim 10,
wherein the inverter includes a current detector, which is configured to detect currents flowing through phases of the inverter based on a voltage drop in current detection resistive elements connected in series to upper arm switching elements, and wherein the third offset voltage computing section is configured to set the fourth constant so that energization time of the upper arm switching elements becomes equal to a lower limit value that enables detection of the currents in the current detection resistive elements.

12. The power converter according to claim 10, further comprising a fourth offset voltage computing section, which is configured to compute a fourth offset voltage based on at least two of the maximum phase, the minimum phase, and the DC voltage, wherein the corrected three-phase voltage command section is configured to output, when an amplitude of the three-phase voltage commands is larger than a preset threshold value, the corrected three-phase voltage commands obtained by subtracting the fourth offset voltage from the three-phase voltage commands.

13. The power converter according to claim 12, wherein the fourth offset voltage computing section is configured to compute the fourth offset voltage by subtracting a fifth DC voltage calculated by multiplying the DC voltage by a fifth constant from the maximum phase, and wherein the fifth constant is set so that a voltage of a largest phase of the three-phase voltages output from the inverter becomes equal to a preset upper limit value.

14. The power converter according to claim 12, wherein the fourth offset voltage computing section is configured to compute the fourth offset voltage by adding a sixth DC voltage calculated by multiplying the DC voltage by a sixth constant to the minimum phase, and wherein the sixth constant is set so that a voltage of a smallest phase of the three-phase voltages output from the inverter becomes equal to a preset lower limit value.

15. The power converter according to claim 12, wherein the fourth offset voltage computing section is configured to obtain an average value of the maximum phase and the minimum phase as the second offset voltage.

16. The power converter according to claim 10, further comprising output voltage detection circuits, which are configured to detect the three-phase voltages output from the inverter, for the phases, wherein the power converter is configured to determine a failure of the inverter based on the three-phase voltages.

17. The power converter according to claim 16, wherein the power converter is configured to determine the failure of the inverter based on the three-phase voltages obtained by removing a carrier wave component from the three-phase voltages detected by the output voltage detection circuits.

18. The power converter according to claim 16, wherein the power converter is configured to determine the failure of the inverter when an addition value of the three-phase voltages for the respective phases, which is obtained by removing a carrier wave component from the three-phase voltages detected by the output voltage detection circuits, deviates from a preset threshold value.

* * * * *